(12) United States Patent
Lu et al.

(10) Patent No.: US 11,025,283 B1
(45) Date of Patent: Jun. 1, 2021

(54) DECODING LATENCY AND THROUGHPUT OF A MULTI-DECODER ERROR CORRECTION SYSTEM

(71) Applicant: SK hynix Inc., Icheon-si (KR)

(72) Inventors: Xuanxuan Lu, San Jose, CA (US); Fan Zhang, Fremont, CA (US); ShiangJyh Steve Chang, San Jose, CA (US); Aman Bhatia, Los Gatos, CA (US)

(73) Assignee: SK hynix, inc., Icheon-si (KR)

( * ) Notice: Subject to any disclaimer, the term of this patent is extended or adjusted under 35 U.S.C. 154(b) by 0 days.

(21) Appl. No.: 16/801,871

(22) Filed: Feb. 26, 2020

(51) Int. Cl.
  *H03M 13/00* (2006.01)
  *H03M 13/11* (2006.01)
  *G06F 11/10* (2006.01)

(52) U.S. Cl.
  CPC ..... *H03M 13/6502* (2013.01); *G06F 11/1068* (2013.01); *H03M 13/1108* (2013.01)

(58) Field of Classification Search
  CPC .................................................. H03M 13/6502
  USPC ........................ 714/764, 762, 768, 770, 767
  See application file for complete search history.

(56) References Cited

U.S. PATENT DOCUMENTS

| | | | | |
|---|---|---|---|---|
| 6,956,872 B1* | 10/2005 | Djokovic | .............. | H04L 1/0041 370/505 |
| 7,590,914 B2* | 9/2009 | Kim | .................. | H03M 13/6362 714/752 |
| 8,341,502 B2* | 12/2012 | Steiner | ............. | H03M 13/2927 714/774 |
| 8,645,810 B2 | 2/2014 | Sharon et al. | | |
| 8,762,798 B2 | 6/2014 | Hu et al. | | |
| 9,281,841 B2 | 3/2016 | Chen et al. | | |
| 9,866,241 B2 | 1/2018 | Yen et al. | | |
| 10,193,578 B2* | 1/2019 | Gross | .................... | H03M 13/09 |
| 10,291,261 B2 | 5/2019 | Yen et al. | | |
| 10,547,327 B2* | 1/2020 | Palangappa | ............ | G05B 11/42 |
| 2017/0168894 A1* | 6/2017 | Kim | ........................ | G11C 29/52 |

(Continued)

OTHER PUBLICATIONS

Le, et al., "On the Use of Hard-Decision LDPC Decoders on MLC NAND Flash Memory", 15th International Multi-Conference on Systems, Signals & Devices (SSD), pp. 1453-1458, Mar. 2018, 6 pages.

*Primary Examiner* — Fritz Alphonse
(74) *Attorney, Agent, or Firm* — Weaver Austin Villeneuve & Sampson LLP

(57) ABSTRACT

Techniques are described for improving the decoding latency and throughput of an error correction system that includes multiple decoders. For example, the error correction system intelligently distributes and balances the decoding of codewords between the different decoders. In particular, the error correction system can consider different factors associated with decoding various codewords including, for instance, the checksum of a codeword that is to be decoded, an estimated number of decoding iterations to decode the codeword by a decoder based on the checksum, and/or an accumulated number of decoding iterations for decoding by the decoder of the codeword in addition to other codewords already buffered for the decoder. Given these factors, the error correction system can generate a decision to decode the codeword by the decoder or by another decoder of the error correction system, where the decision optimizes the performance.

20 Claims, 13 Drawing Sheets

(56) References Cited

U.S. PATENT DOCUMENTS

| | | |
|---|---|---|
| 2017/0269991 A1* | 9/2017 | Bazarsky ............ G06F 11/1012 |
| 2018/0032396 A1 | 2/2018 | Sharon et al. |
| 2019/0097653 A1 | 3/2019 | Zhang et al. |
| 2019/0103885 A1 | 4/2019 | Chang et al. |
| 2019/0288713 A1 | 9/2019 | Kumar et al. |

* cited by examiner $$200 \quad H = \begin{bmatrix} 1 & 0 & 1 & 0 & 0 & 1 \\ 1 & 1 & 0 & 0 & 1 & 0 \\ 1 & 0 & 0 & 1 & 0 & 0 \\ 0 & 1 & 0 & 1 & 0 & 1 \end{bmatrix}$$

Variable Nodes    Check Nodes

DECODING LATENCY AND THROUGHPUT OF A MULTI-DECODER ERROR CORRECTION SYSTEM

BACKGROUND

Data integrity is an important feature for any data storage device and data transmission. Use of strong error-correction codes (ECCs) is recommended for various types of data storage devices include NAND flash memory devices. ECCs are also frequently used during the process of data transmission.

ECC refers to codes that add redundant data, or parity data, to a message, such that the message can be recovered by a receiver even when a number of errors were introduced, either during the process of transmission, or storage. In general, the ECC can correct the errors up to the capability of the code being used.

Low-density parity-check (LDPC) codes are an example of ECC. Generally, an LDPC error correction system is used to decode information bits. In certain implementations, the LDPC error correction system can include multiple LDPC decoders. Each of the LDPC decoders can be used to decode a set of the LDPC codes.

BRIEF SUMMARY

Techniques are described for improving the decoding latency and throughput of an error correction system that includes multiple decoders. In an example, the error correction system implements a method. The method includes accessing a first codeword that is to be decoded by one of the multiple decoders. The multiple decoders include a first decoder and a second decoder. The first decoder has a lower decoding latency than the second decoder. The method also includes estimating a first number of decoding iterations for decoding the first codeword by the first decoder. The method also includes determining an estimated second number of decoding iterations for decoding a second codeword by the first decoder. The second codeword is buffered in a first memory buffer of the first decoder. The method also includes determining that the first codeword is to be stored in a memory buffer of the error correction system. The memory buffer is one of the first memory buffer of the first decoder or a second memory buffer of the second decoder dependently on the estimated first number and the estimated second number. The method also includes storing the first codeword in the memory buffer.

In an example, the method also includes computing a checksum of the first codeword. The first number of decoding iterations is estimated based on the checksum. In this example, the first number of decoding iterations is defined as a function of the checksum. The function is stored by the error correction system and is used to estimate the first number of decoding iterations upon the computation of the checksum. Also in this example, the function is stored as a checksum-number of decoding iterations curve. For instance, the function is defined based on at least one testing or simulation of performance of instances of the first decoder. Also in this example, the method includes computing an accumulated number of decoding iterations as a sum of at least the estimated first number and the estimated second number, comparing the accumulated number and a number threshold, and selecting the memory buffer to be one of the first memory buffer or the second memory buffer based on an outcome of the comparison of the accumulated number and the number threshold. The number threshold is variable based on a life of the memory. The memory buffer is selected to be the first memory buffer and not the second memory buffer based on the comparison indicating that the accumulated number is smaller than the number threshold. In an illustration, the comparison indicates that the accumulated number is greater than the number threshold. In this case, the method also includes comparing the checksum and a checksum threshold and selecting the memory buffer to be one of the first memory buffer or the second memory buffer based on an outcome of the comparison of the checksum to the checksum threshold. The memory buffer is selected to be the first memory buffer and not the second memory buffer based on the comparison indicating that the checksum is smaller than the checksum threshold. The memory buffer is selected to be the second memory buffer and not the first memory buffer based on the comparison indicating that the checksum is greater than the checksum threshold.

In an example, the error correction system includes multiple decoders. The multiple decoders include a first decoder and a second decoder. The first decoder has a lower decoding latency than the second decoder. The error correction system also includes a controller configured with program code to perform operations. The operations include accessing a first codeword that is to be decoded by one of the multiple decoders. The operations also include estimating a first number of decoding iterations for decoding the first codeword by the first decoder. The operations also include determining an estimated second number of decoding iterations for decoding a second codeword by the first decoder. The second codeword is buffered in a first memory buffer of the first decoder. The operations also include determining that the first codeword is to be stored in a memory buffer of the error correction system. The memory buffer is one of the first memory buffer of the first decoder or a second memory buffer of the second decoder dependent on the estimated first number and the estimated second number. The operations also include storing the first codeword in the memory buffer.

In an example, the first codeword is a low density parity check (LDPC) codeword. The first decoder is a bit flipping (BF) decoder. The second decoder is a min-sum (MS) decoder.

In an example, the controller is further configured to perform additional operations. The additional operations include computing a checksum of the first codeword. The first number of decoding iterations is estimated based on a function that defines the checksum as a variable. The additional operations also include computing a first accumulated number of decoding iterations as a sum of at least the estimated first number of decoding iterations and the estimated second number of decoding iterations. The additional operations also include selecting the memory buffer to be one of the first memory buffer or the second memory buffer based on a comparison of the first accumulated number and a number threshold. In this example, the multiple decoders include a third decoder that has a lower decoding latency than the second decoder. The additional operations also include determining that the first accumulated number is greater than the number threshold, and determining an estimated third number of decoding iterations for decoding a third codeword by the third decoder. The third codeword is buffered in a third memory buffer of the third decoder. The additional operations also include computing a second accumulated number of decoding iterations as a sum of at least the estimated first number of decoding iterations and the estimated third number of decoding iterations. The additional operations also include selecting the memory buffer to be one of the second memory buffer or the third memory buffer and not the first memory buffer based on a comparison of the second accumulated number and the number threshold.

Additionally or alternatively, the additional operations also include determining that the first accumulated number is greater than the number threshold and determining an estimated third number of decoding iterations for decoding a third codeword by the third decoder. The third codeword is buffered in a third memory buffer of the third decoder. The additional operations also include computing a second accumulated number of decoding iterations as a sum of at least the estimated first number of decoding iterations and the estimated third number of decoding iterations. The additional operations also include determining that the second accumulated number is greater than the number threshold, determining that the checksum is smaller than a checksum threshold, and selecting the memory buffer to be one of the first memory buffer or the third memory buffer and not the second memory buffer based on the first accumulated number and the second accumulated number being greater than the number threshold and based on the checksum being smaller than the checksum threshold.

Additionally or alternatively, the additional operations also include determining an estimated third number of decoding iterations for decoding a third codeword by the third decoder. The third codeword is buffered in a third memory buffer of the third decoder. The additional operations also include computing a second accumulated number of decoding iterations as a sum of at least the estimated first number of decoding iterations and the estimated third number of decoding iterations. The additional operations also include determining that each of the first accumulated number and the second accumulated number is smaller than the number threshold. The additional operations also include selecting the memory buffer to be one of the first memory buffer or the third memory buffer and not the second memory buffer based on the first accumulated number and the second accumulated number being smaller than the number threshold.

In an example, a memory device stores computer-readable instructions, that upon execution by an error correction system of the memory device, cause the error correction system to perform operations. The operations include accessing a first codeword that is to be decoded by one of multiple decoders of the error correction system. The multiple decoders include a first decoder and a second decoder. The first decoder has a lower decoding latency than the second decoder. The operations also include estimating a first number of decoding iterations for decoding the first codeword by the first decoder. The operations also include determining an estimated second number of decoding iterations for decoding a second codeword by the first decoder. The second codeword is buffered in a first memory buffer of the first decoder. The operations also include determining that the first codeword is to be stored in a memory buffer of the error correction system. The memory buffer is one of the first memory buffer of the first decoder or a second memory buffer of the second decoder dependent on the estimated first number and the estimated second number. The operations also include storing the first codeword in the memory buffer.

In the above example, the operations also include computing a checksum of the first codeword. The first number of decoding iterations is estimated based on the checksum. The operations also include computing an accumulated number of decoding iterations as a sum of at least the estimated first number of decoding iterations and the estimated second number of decoding iterations. The operations also include determining that the accumulated number exceeds a number threshold, and removing and sending the second codeword from the first memory buffer to the second memory buffer based on the accumulated number exceeding the number threshold.

In the above example, the operations also include determining that the estimated second number of decoding iterations exceeds a second number threshold. The operations also include determining an estimated third number of decoding iterations for decoding a third codeword by the second decoder. The codeword is buffered in the second memory buffer of the second decoder. The operations also include computing a second accumulated number of decoding iterations based on the estimated third number. The operations also include determining that the second accumulated number is smaller than a third number threshold. The second codeword is removed and sent from the first memory buffer to the second memory buffer based on the estimated second number of decoding iterations exceeding the second number threshold and on the second accumulated number being smaller than the third number threshold.

BRIEF DESCRIPTION OF THE DRAWINGS

An understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Figure 1:
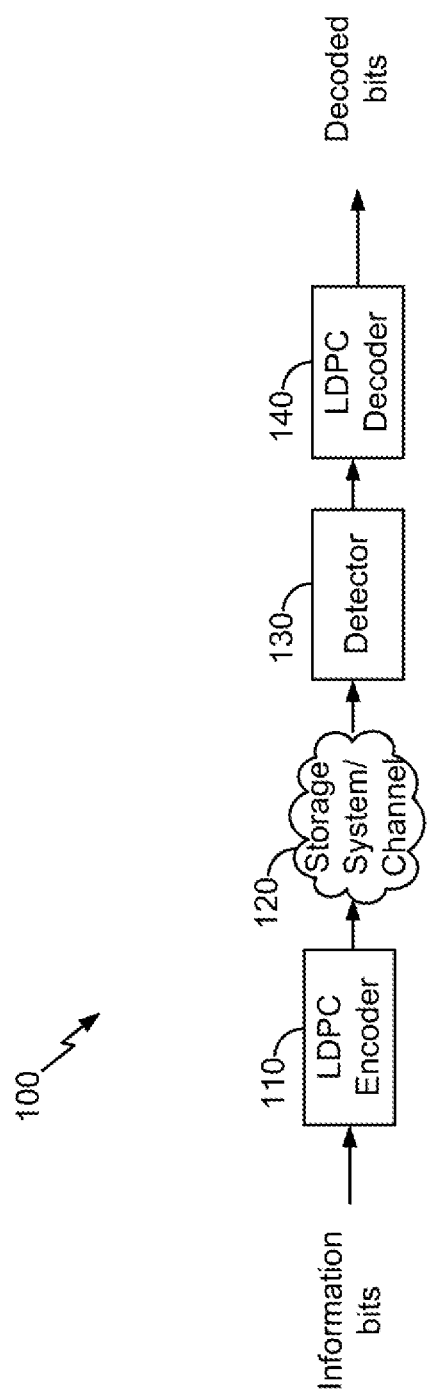
FIG. 1 illustrates an example high level block diagram of an error correcting system, in accordance with certain embodiments of the present disclosure.

Embodiments of the present disclosure involve improving the decoding latency and throughput of an error correction system that includes multiple decoders. Generally, the latency and throughput of the error correction system can be improved over an existing error correction system that uses a single decoder. For instance, at least one of the multiple decoders is implemented as a low latency and high throughput decoder, and at least another one of the multiple decoders is implemented as a high error correction capability decoder. In this way, decoding codewords can be distributed between the two decoders depending on the noisiness. In particular, codewords having low error bits can be sent to and decoded by the low latency and high throughput decoder and, as necessary, codewords having high error bits can be sent to and decoded by the high error correction capability decoder. Accordingly, the overall performance (e.g., latency and throughput) of the error correction system is improved because the high error correction capability decoder is used as necessary.

Nonetheless, further improvements to the performance of the error correction system can be made. As further discussed in connection with FIG. 4, in certain situations, a large number of codewords can be queued for decoding by the low latency and high throughput decoder. This queuing can decrease the performance because the latency to decode the large number of queued codewords increases. In addition, the decoding by the low latency and high throughput decoder may still fail and would necessitate another set of decoding iterations by the high error correction capability decoder, thereby further exacerbating the decoding latency.

Embodiments of the present inventions enable the further improvements by intelligently distributing and balancing the decoding of codewords between the different decoders. The intelligence can be implemented as logic that considers different factors associated with decoding various codewords including, for instance, the checksum of a codeword that is to be decoded, an estimated number of decoding iterations to decode the codeword by a decoder based on the checksum, and/or an accumulated number of decoding iterations for decoding by the decoder of the codeword in addition to other codewords already buffered for the decoder. Given these factors, a decision can be made to decode the codeword by the decoder or by another decoder of the error correction system, where the decision optimizes the performance.

Many technical advantages for using the implemented logic can be achieved. In an example, the implemented logic enables the distribution of codewords among the decoders by estimating whether a low latency and high throughput decoder can effectively decode a codeword. If so, the codeword is sent to the low latency and high throughput decoder. Otherwise, the decoding skips the low latency and high throughput decoder and proceeds to a high error correction capability instead. In this way, the low latency and high throughput decoder is intelligently used when this usage is expected to be effective and, otherwise, the high error correction capability is immediately used. Accordingly, the overall decoding latency and throughput of the error correction system is further improved.

FIG. 1 illustrates an example high level block diagram of an error correcting system 100, in accordance with certain embodiments of the present disclosure. In the example, LDPC codes are described in connection with data storage. However, the embodiments of the present disclosure are not limited as such. Instead, the embodiments similarly apply to other usage of LDPC codes including, for example, data transmission. Further, the embodiments of the present disclosure can similarly apply to other error correction codes for which the above factors can be computed.

LDPC codes are linear block codes defined by a sparse parity-check matrix H, which consists of zeros and ones. The term "sparse matrix" is used herein to refer to a matrix in which a number of non-zero values in each column and each row is much less than its dimension. The term "column weight" is used herein to refer to the number of non-zero values in a specific column of the parity-check matrix H. The term "row weight" is used herein to refer to number of non-zero values in a specific row of the parity-check matrix H. In general, if column weights of all of the columns in a parity-check matrix corresponding to an LDPC code are similar, the code is referred to as a "regular" LDPC code. On the other hand, an LDPC code is called "irregular" if at least one of the column weights is different from other column weights. Usually, irregular LDPC codes provide better error correction capability than regular LDPC codes.

The LDPC codes are also described according to the way they are constructed. Random computer searches or algebraic constructions are possible. The random computer search construction describes an LDPC code having a parity-check matrix designed by a random computer-based procedure. Algebraic construction implies that the parity-check matrix has been constructed based on combinatorial methods. Quasi-cyclic LDPC (QC-LDPC) codes fall under the latter construction method. One advantage of QC-LDPC codes is that they have a relatively easier implementation in terms of the encoding procedure. The main feature of QC-LDPC codes is that the parity-check matrix consists of circulant submatrices, which could be either based on an identity matrix or a smaller random matrix. Permutation vectors could also be used in order to create the circulant submatrices.

As illustrated, an LDPC encoder 110 receives information bits that include data which is desired to be stored in a storage system 120. LDPC encoded data is output by the LDPC encoder 110 and is written to the storage 120.

In various embodiments, the storage 120 may include a variety of storage types or media such as (e.g., magnetic) disk drive storage, flash storage, etc. In some embodiments, the techniques are employed in a transceiver and instead of being written to or read from storage, the data is transmitted and received over a wired and/or wireless channel. In this case, the errors in the received codeword may be introduced during transmission of the codeword.

When the stored data is requested or otherwise desired (e.g., by an application or user which stored the data), a detector 130 receives data from the storage system 120. The received data may include some noise or errors. The detector 130 performs detection on the received data and outputs decision and/or reliability information. For example, a soft output detector outputs reliability information and a decision for each detected bit. On the other hand, a hard output detector outputs a decision on each bit without providing corresponding reliability information. As an example, a hard output detector may output a decision that a particular bit is a "1" or a "0" without indicating how certain or sure the detector is in that decision. In contrast, a soft output detector outputs a decision and reliability information associated with the decision. In general, a reliability value indicates how certain the detector is in a given decision. In one example, a soft output detector outputs a log-likelihood ratio (LLR) where the sign indicates the decision (e.g., a positive value corresponds to a "1" decision and a negative value corresponds to a "0" decision) and the magnitude indicates how sure or certain the detector is in that decision (e.g., a large magnitude indicates a high reliability or certainty).

The decision and/or reliability information is passed to a LDPC decoder 140 which performs LDPC decoding using the decision and reliability information. A soft input decoder utilizes both the decision and the reliability information to decode the codeword. A hard decoder utilizes only the decision values in the decoder to decode the codeword. The decoded bits generated by the LDPC decoder 140 are passed to the appropriate entity (e.g., the user or application which requested it). With proper encoding and decoding, the information bits match the decoded bits.

In various embodiments, the system shown may be implemented using a variety of techniques including an application-specific integrated circuit (ASIC), a field-programmable gate array (FPGA), and/or a general purpose processor (e.g., an Advanced RISC Machine (ARM) core).

LDPC codes are usually represented by bipartite graphs. One set of nodes, the variable or bit nodes correspond to elements of the codeword and the other set of nodes, e.g., check nodes, correspond to the set of parity-check constraints satisfied by the codeword. Typically the edge connections are chosen at random. The error correction capability of an LDPC code is improved if cycles of short length are avoided in the graph. In a (r,c) regular code, each of the n variable nodes (V1, V2, . . . , Vn) has connections to r check nodes and each of the m check nodes (C1, C2, . . . , Cm) has connections to c bit nodes. In an irregular LDPC code, the check node degree is not uniform. Similarly the variable node degree is not uniform. In QC-LDPC codes, the parity-check matrix H is structured into blocks of p×p matrices such that a bit in a block participates in only one check equation in the block, and each check equation in the block involves only one bit from the block. In QC-LDPC codes, a cyclic shift of a codeword by p results in another codeword. Here p is the size of square matrix which is either a zero matrix or a circulant matrix. This is a generalization of a cyclic code in which a cyclic shift of a codeword by 1 results in another codeword. The block of p×p matrix can be a zero matrix or cyclically shifted identity matrix of size p×p.

Figures 2A, 2B:
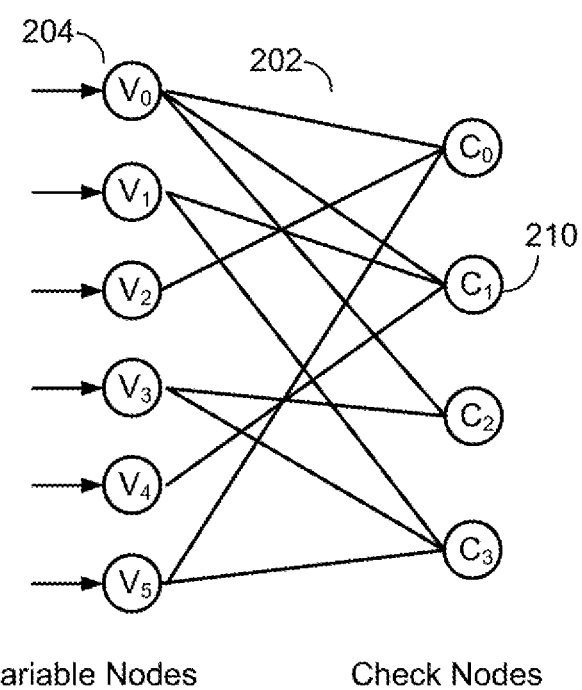
FIGS. 2A-2B illustrate an example parity-check matrix and an example graph representing the parity-check matrix, in accordance with certain embodiments of the present disclosure.

FIG. 2A illustrates an example parity-check matrix H 200 and FIG. 2B illustrates an example bipartite graph corresponding to the parity-check matrix 200, in accordance with certain embodiments of the present disclosure. In this example, the parity-check matrix 200 has six column vectors and four row vectors. Network 202 shows the network corresponding to the parity-check matrix 200 and represent a bipartite graph. Various type of bipartite graphs are possible, including, for example, a Tanner graph.

Generally, the variable nodes in the network 202 correspond to the column vectors in the parity-check matrix 200. The check nodes in the network 202 correspond to the row vectors of the parity-check matrix 200. The interconnections between the nodes are determined by the values of the parity-check matrix 200. Specifically, a "1" indicates the corresponding check node and variable nodes have a connection. A "0" indicates there is no connection. For example, the "1" in the leftmost column vector and the second row vector from the top in the parity-check matrix 200 corresponds to the connection between the variable node 204 and the check node 210.

A message passing algorithm is generally used to decode LDPC codes. Several variations of the message passing algorithm exist in the art, such as min-sum (MS) algorithm, sum-product algorithm (SPA) or the like. Message passing uses a network of variable nodes and check nodes, as shown in FIG. 2B. The connections between variable nodes and check nodes are described by and correspond to the values of the parity-check matrix 200, as shown in FIG. 2A.

A hard decision message passing algorithm may be performed. In a first step, each of the variable nodes sends a message to one or more check nodes that are connected to it. In this case, the message is a value that each of the variable nodes believes to be its correct value.

In the second step, each of the check nodes calculates a response to send to the variable nodes that are connected to it using the information that it previously received from the variable nodes. This step can be referred as the check node update (CNU). The response message corresponds to a value that the check node believes that the variable node should have based on the information received from the other variable nodes connected to that check node. This response is calculated using the parity-check equations which force the values of all the variable nodes that are connected to a particular check node to sum up to zero (modulo 2).

At this point, if all the equations at all the check nodes are satisfied, the decoding algorithm declares that a correct codeword is found and it terminates. If a correct codeword is not found, the iterations continue with another update from the variable nodes using the messages that they received from the check nodes to decide if the bit at their position should be a zero or a one by a majority rule. The variable nodes then send this hard decision message to the check nodes that are connected to them. The iterations continue until a correct codeword is found, a certain number of iterations are performed depending on the syndrome of the codeword (e.g., of the decoded codeword), or a maximum number of iterations are performed without finding a correct codeword. It should be noted that a soft-decision decoder works similarly, however, each of the messages that are passed among check nodes and variable nodes, also include reliability of each bit.

An example message passing algorithm may be performed. In this example, $L(q_{ij})$ represents a message that is sent by variable node $v_i$ to check node $c_j$; $L(r_{ji})$ represents the message sent by check node $c_j$ to variable node $v_i$; and $L(c_i)$ represents initial LLR value for each variable node $v_i$. Variable node processing for each $L(q_{ij})$ can be done through the following steps:

(1) Read $L(c_i)$ and $L(r_{ji})$ from memory.

(2) Calculate $L(Q_{i\text{-sum}}) = L(c_i) + \text{Scaling Factor} * \sum_{j' \in c_i} L(r_{ij'})$.

(3) Calculate each L(Qi-sum)−L($r_{ij}$).
(4) Output L(Qi-sum) and write back to memory.
(5) If this is not the last column of the memory, go to Step 1 and increment i by one.
(6) Compute parity-check-sums (e.g., syndrome), if they are all equal to zero, the number of iterations reaches a threshold and the parity-check-sums are greater than another threshold, or the number of iterations equals a maximum limit, stop; otherwise, perform check node processing.

Check node processing for each L(rji) can be performed as follows:
(1) Read one row of qij from memory.
(2) Calculate L(Rj-sum) as follows:

$$L(Rj\text{-sum}) = (\Pi_{i' \in R_j} \oplus_{i'j})\emptyset(\Sigma_{i' \in R_j}\emptyset(\beta_{i'j}))$$

$$\alpha_{ij} = \text{sign}(L(q_{ij})), \beta_{ij} = |L(q_{ij})|,$$

$$\emptyset(x) = -\log\left(\tanh\left(\frac{x}{2}\right)\right) = \log\left(\frac{e^x + 1}{e^x - 1}\right)$$

(3) Calculate the individual L($r_{ji}$)=$(\Pi_{i' \in R_{j|i}} \alpha_{i'j})\emptyset(\Sigma_{i' \in R_{j|i}}\emptyset(\beta_{i'j}))$ for check nodes.
(4) Write back L($r_{ij}$) to memory.
(5) If this is not the last row of memory, then go to the first step and increment j by one.

Figure 3:
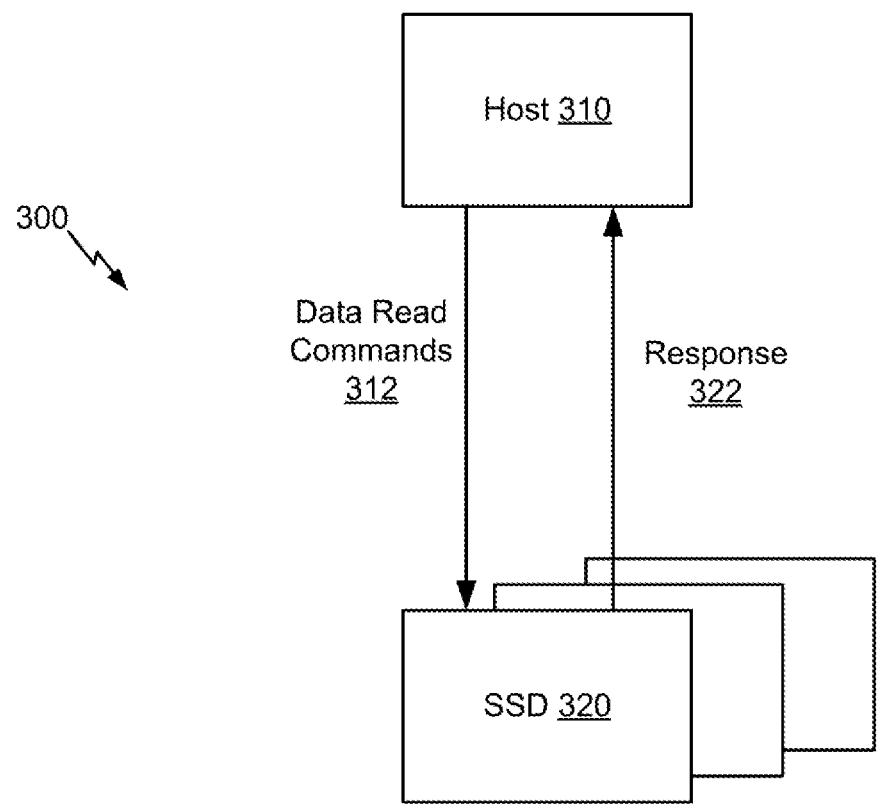
FIG. 3 illustrates an example architecture of a computer system, in accordance with certain embodiments of the present disclosure.

FIG. 3 illustrates an example architecture of a computer system 300, in accordance with certain embodiments of the present disclosure. In an example, the computer system 300 includes a host 310 and multiple SSDs 300. The host 310 stores data on behalf of clients in the SSDs 300. The data is stored in an SSD as codewords for ECC protection. For instance, the SSD can include an ECC encoder (e.g., the LDPC encoder 110 of FIG. 1). For a same client, portions of the data can be distributed across the SSDs 300 for security or can be redundantly stored in multiple SSDs 300.

The host 310 can receive a request of a client for the client's data stored in the SSDs 300. In response, the host sends data read commands 312 to the SSDs 300 as applicable. Each of such SSDs 300 processes the received data read command and sends a response 322 to the host 310 upon completion of the processing. The response 322 can include the read data and/or a decoding failure. In an example, each of the SSDs includes an ECC decoder (e.g., the LDPC decoder 140 of FIG. 1). The ECC decoder can include multiple decoders. Processing the data read command and sending the response 322 includes decoding by the ECC decoder the codewords stored in the SSD to output the read data and/or the decoding failure. The decoding can intelligently distribute the codewords among the various decoders based on a number of factors including, checksums, estimated numbers of decoding iterations, and accumulated numbers of iterations, as further described in connection with the next figures.

Generally, an SSD can be a storage device that stores data persistently or caches data temporarily in nonvolatile semiconductor memory and is intended for use in storage systems, servers (e.g., within datacenters), and direct-attached storage (DAS) devices. A growing number of applications need high data throughput and low transaction latency and SSDs are used as a viable storage solution to increase the performance, efficiency, reliability and lowering overall operating expenses. SSDs generally use NAND flash memory and deliver higher performance and consume less power than spinning hard-disk drives (HDDs). NAND Flash memory has a number of inherent issues associated with it, the two most important include a finite life expectancy as NAND Flash cells wear out during repeated writes, and a naturally occurring error rate. SSDs can be designed and manufactured according to a set of industry standards that define particular performance specifications, including latency specifications, to support heavier write workloads, more extreme environmental conditions and recovery from a higher bit error rate (BER) than a client SSD (e.g., personal computers, laptops, and tablet computers).

Figure 4:
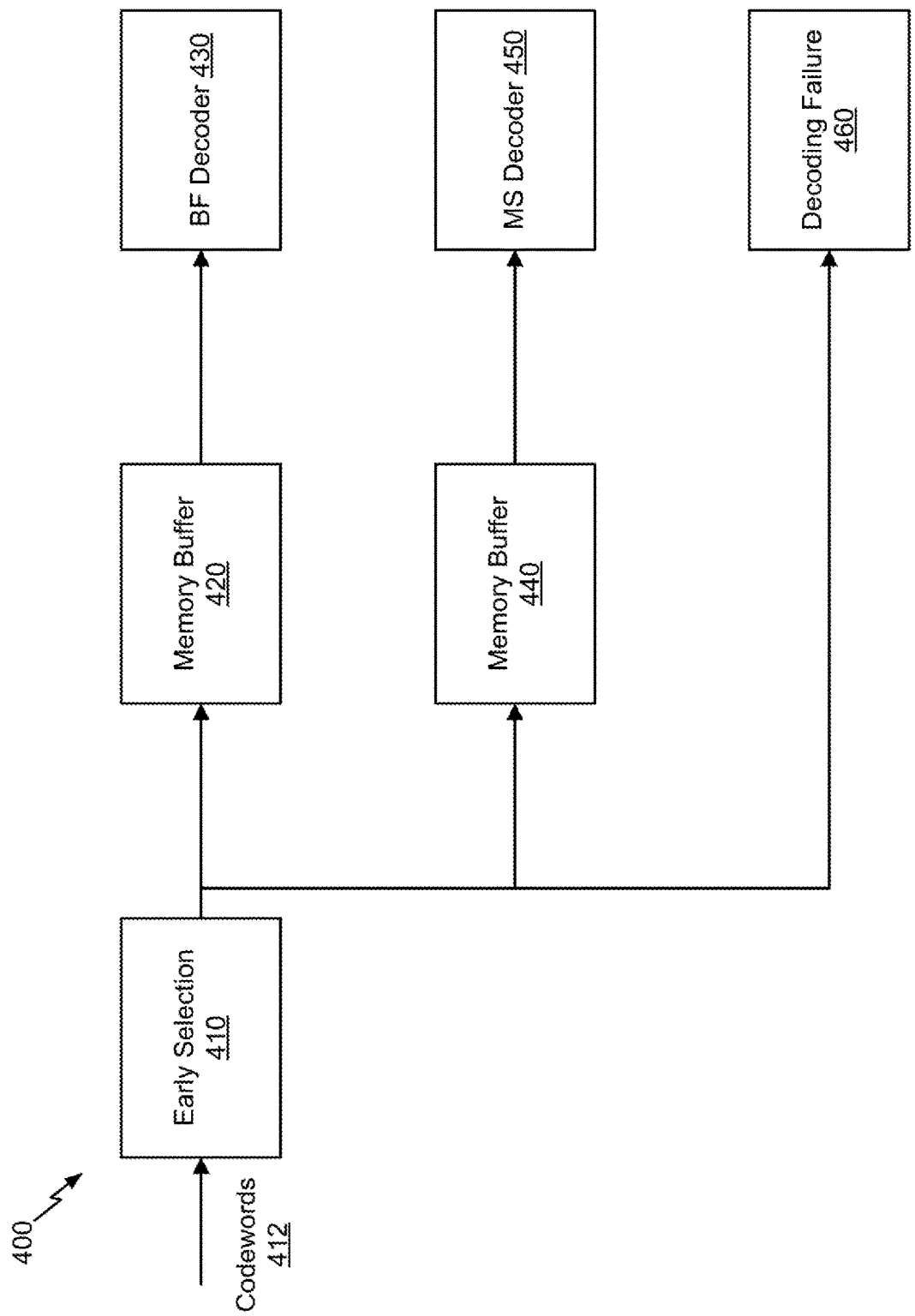
FIG. 4 illustrates an example error correction system that includes multiple decoders, in accordance with certain embodiments of the present disclosure.

FIG. 4 illustrates an example error correction system 400 that includes multiple decoders, in accordance with certain embodiments of the present disclosure. The error correction system 400 implements logic that includes an early selection (ES) block 410. The error correction system 400 also includes a memory buffer 420 corresponding to a bit flipping (BF) decoder 430 and a memory buffer 440 corresponding to a min-sum decoder 450. The ES block 410 determines which of the two decoders 430 and 450 are used to decode different codewords 412 based on the estimate of the number of raw bit-errors for each of the codewords. The bit-errors can be due to noise and, accordingly, the codewords 412 can be noisy codewords.

If the ES block 410 determines that a codeword has a severe bit error rate, a decoding failure 460 is likely with the two decoders 4430 and 450. Otherwise, the codeword can be dispatched to the BF decoder 430 when the ES block 410 determines that the bit-error rate falls into the BF correction capability. Alternatively, the codeword can be dispatched to the MS decoder 450 when the ES block 410 determines that the bit-error rate is outside of the BF correction capability. Dispatching the codeword includes storing the codeword into one of the memory buffers 420 or 440 depending on the ES block's 410 determination. The memory buffers 420 and 440 are used because, in certain situation, the decoding latency is slower than the data read rate of a host reading the codewords 412.

Accordingly, over time, the codewords 412 are stored in different input queues for the BF decoder 430 and the MS decoder 450. For typical SSD usage, it is expected that most traffic would go to the BF decoder 430. However, if the BF decoder's 430 input queue is full (e.g., the memory buffer 420 is full), incoming codewords are not dispatched to the BF decoder 430 until decoding of buffered codewords is complete such that space is freed in the memory buffer 420 for the incoming codewords. Alternatively, the incoming codewords are dispatched instead to the MS decoder 450 (e.g., when the memory buffer 520 is full, despite that the BF error correction capability can handle the decoding of such codewords). Both approaches typically use long decoding latency for these codewords and, hence, can lower the decoding throughput.

In the specific example of flash memory-based SSDs, ECC implementation in the SSD controller may use two kinds of decoders: BF decoder and MS decoder. Noisy codewords are dispatched to different decoders based on the input bit error rate. Most traffic would go to the BF decoder in typical usage scenarios. However, codewords may be dispatched directly to the MS decoder in the following two scenarios. First, when the noise in the codeword is expected to exceed BF correction capability, but is expected to be within MS correction capability. Second, when the input queue of the BF decoder is full. As explained herein above, this can result in long decoding latency. Hence, it is desirable to decrease the decoding-latency when the input queue of the BF decoder is almost full. This is possible by careful selection of noisy codewords that are dispatched to the BF decoder queue, as described in connection with the next figures.

Figure 5:
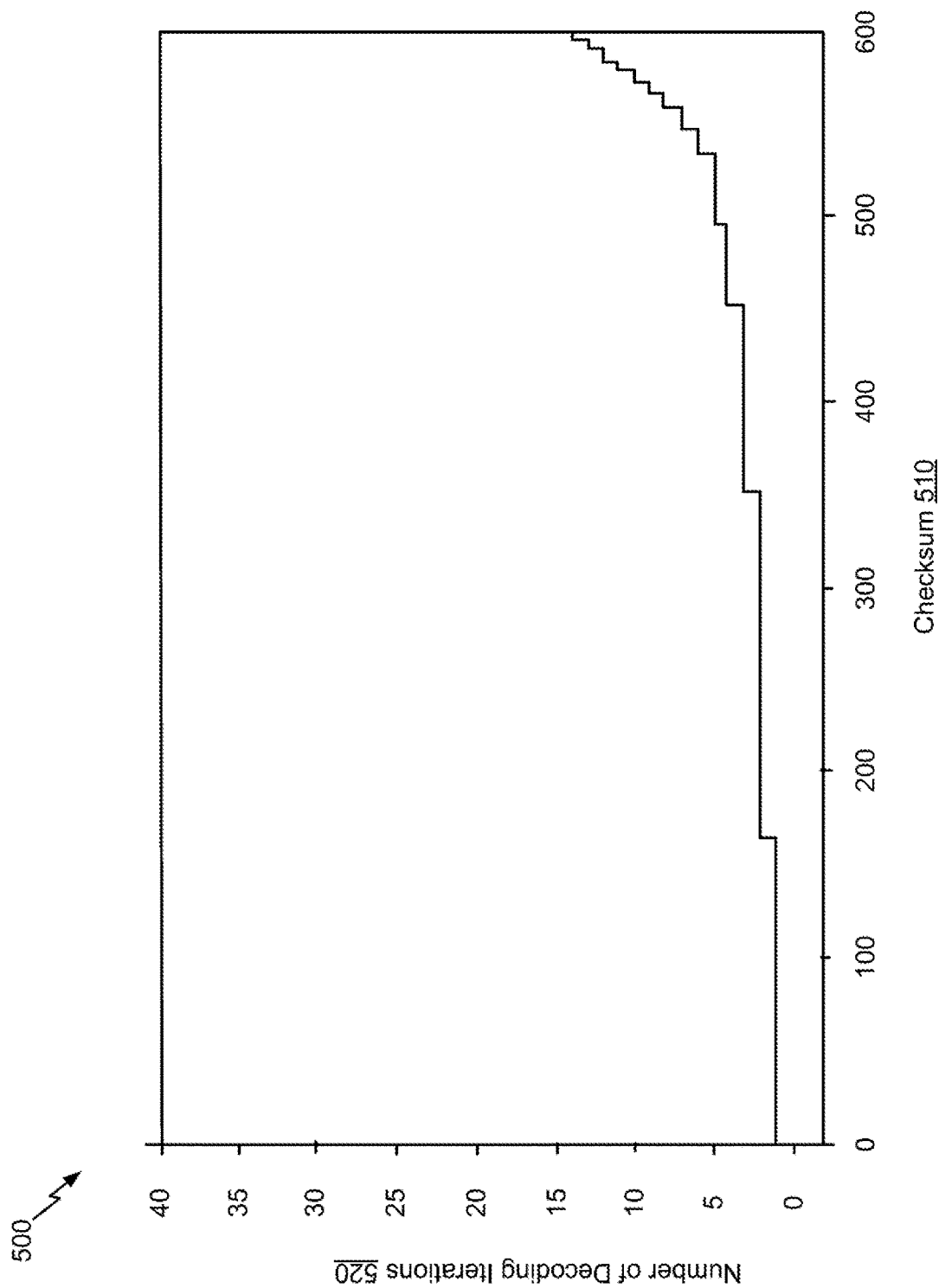
FIG. 5 illustrates an example association between a checksum of a codeword and a number of decoding iterations to decoder the codeword, in accordance with certain embodiments of the present disclosure.

FIG. 5 illustrates an example association 500 between a checksum of a codeword and a number of decoding iterations to decoder the codeword, in accordance with certain embodiments of the present disclosure. In an example, the association 500 is generated based on actual data measured in a testing environment, such as a lab environment, and/or based on simulated data computed in the testing environment. The testing environment can assess (measure and/or compute) the number(s) of iteration per particular value of the checksum. The association 500 can be stored as a function. The function can be expressed as with an equation where the checksum is a variable and the number of decoding iterations is the computed value given the variable. This function can be a regression function or an estimation function derived from the actual and/or simulated data. Alternatively or additionally, the function can be expressed as a curve derived from the actual and/or simulated data (e.g., the curve can be a moving average curve, a regression curve, etc.). In both examples, the function can be stored in local memory of an error correction system and available to a controller during the decoding of codewords.

In the illustration of FIG. 5, the association 500 is a curve that plots a checksum 510 on a horizontal axis and a number of decoding iterations 520 on a vertical axis. Given a checksum of a codeword, the controller can look-up the corresponding number of decoding iteration 520 from the curve. For instance, if the checksum is five-hundred and fifty, the controller can estimate the number of decoding iterations to be five.

The association 500 can be generated for a particular ECC (e.g., LDPC codes using a particular parity check matrix) and for a particular type of ECC decoder. For instance, one association is generated for an LDPC code that uses a particular parity check matrix and for a BF decoder having a particular error correction capability. Another association is generated for the LDPC code and for a MS decoder having a particular error correction capability. Once generated, theses associations can be stored locally by an error correction system that implements the particular LDPC code, the BF decoder, and the MS decoder.

Figure 6:
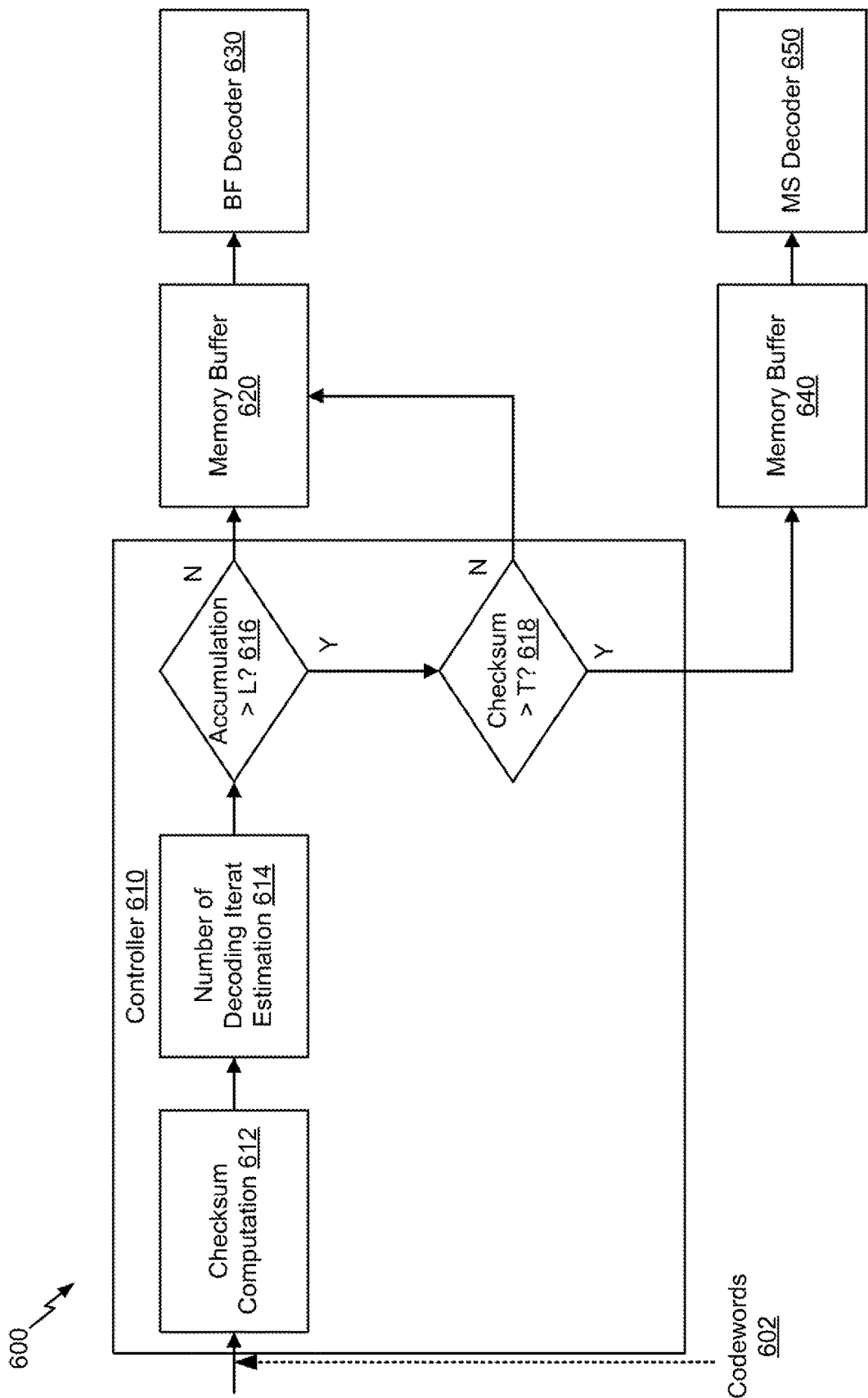
FIG. 6 illustrates an example error correction system that includes multiple decoders and that balances the decoding of codewords based on estimated numbers of decoding iterations, in accordance with certain embodiments of the present disclosure.

FIG. 6 illustrates an example error correction system 600 that includes multiple decoders and that balances the decoding of codewords based on estimated numbers of decoding iterations, in accordance with certain embodiments of the present disclosure. In the interest of clarity of explanation, two decoders are illustrated in FIG. 6. A first decoder is a BF decoder 630 and a second decoder is a MS decoder 650. Of course other types of decoders can be used depending on the ECC, the targeted error correction capability, and the targeted decoding latency and throughput. Generally, the first decoder has a lower decoding latency and/or higher decoding throughput than the second decoder, whereas the second decoder has a higher error correction capability than the first decoder.

As illustrated, in addition to the BF decoder 630 (or more generally a first decoder with a relatively lower decoding latency and/or higher decoding) and the MS decoder 650 (or more generally a second decoder with a relatively higher error correction capability), the error correction system 600 includes a controller 610, a memory buffer 620 corresponding to the BF decoder 630 (which can be generally referred to as a memory buffer of the first decoder or a first memory buffer) and a memory buffer 640 corresponding to the MS decoder (which can be generally referred to as a memory buffer of the second decoder or a second memory buffer). The controller 610 implements, in software and/or hardware, a decision logic to intelligently distribute the decoding of codewords 602 between the BF decoder 630 and the MS decoder 650.

In an example, the decision logic includes a checksum computation 612, a number of decoding iterations estimation 614, an accumulated number comparison 616, and a checksum comparison 618. In particular, the checksum computation 612 computes the checksum of each of the codewords. Computing the checksum of a codeword depends on the encoding procedure. For instance, and for LDPC encoding that uses a parity check matrix "H," the checksum "S" is computed as $S=r\times H$, where "r" are the bits of the codewords (e.g., the noisy bits before error correction). The number of decoding iterations estimation 614 estimates, for each of the codewords, the number of decoding iterations needed by the BF decoder 630 (or, similarly as needed, by the MS decoder 650). The estimation can include using the checksum of the codeword in a look-up of the checksum-number of decoding iterations association (e.g., the association 500 of FIG. 5 when generated for the particular ECC and the BF decoder 630). The accumulated number comparison 616 includes computing an accumulated number of decoding iterations corresponding to a codeword to be decoded and to one or more codewords already queued in the memory buffer 520. For instance, and for an estimated number of decoding iterations for a codeword to be decoded, the accumulated number is equal to the sum of this estimated number plus the estimated numbers for the previously buffered but not yet decoded codewords in the memory buffer 620. The accumulated number comparison 616 can also include comparing the accumulated number to a predefined number threshold "L". The checksum comparison 618 can compare the checksum of a codeword to be decoded to a predefined checksum threshold "T". Depending on the accumulated number comparison 616 and the checksum comparison 618, the controller 610 can dispatch to one of the BF decoder 630 or the MS decoder 650.

To illustrate, a first codeword is to be decoded. As a second codeword is buffered in the memory buffer 620 but has not been decoded yet. The controller 610 computed a checksum of the first codeword. Based on this checksum, the controller 610 estimates a first number of decoding iterations needed by the BF decoder 630 to decode the first codeword. The controller 610 computed an accumulated number by summing the estimated first number of decoding iterations with an estimated second number of decoding iterations. This estimated second number corresponds to the estimated number of decoding iterations need by the BF decoder 630 to decode the second codeword. Of course, if other codewords are buffered in the memory buffer 620 and have not been decoded yet, their corresponding estimated number of decoding iterations are added to the sum. The controller 610 compares the accumulated number to the number threshold "L." If smaller than the number threshold "L," the first codeword is dispatched to the BF decoder 630 by sending this first codeword to the memory buffer 620. If larger than the number threshold "L," the controller 610 determines whether the checksum of the codeword exceeds the checksum threshold "T" or not. If the checksum is smaller than the checksum threshold "T," the controller 620 dispatches the first codeword to the BF decoder 630. Otherwise, the first codeword is dispatched to the MS decoder 650 by sending it to the memory buffer 640.

Figure 7:
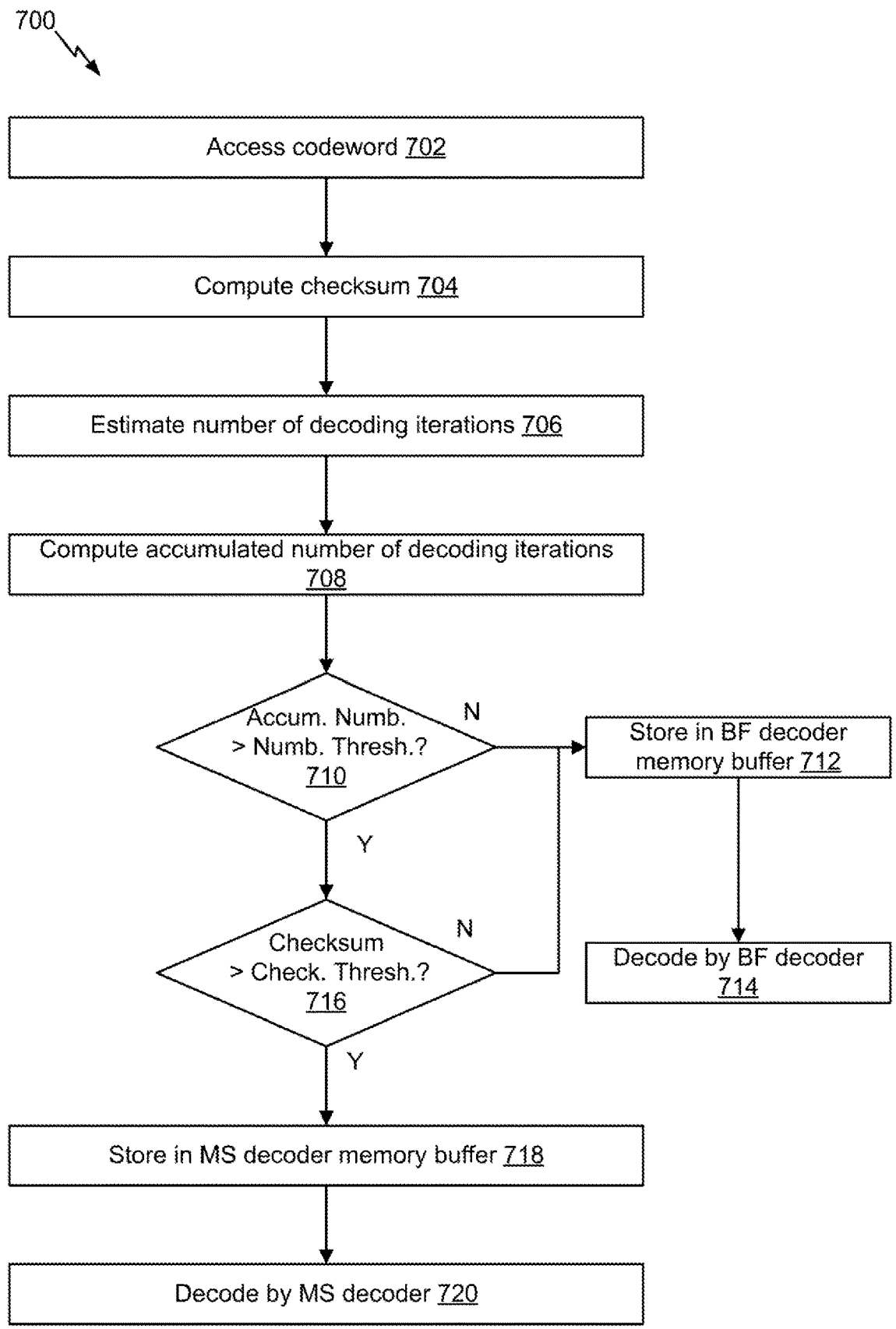
FIG. 7 illustrates an example flow for decoding of codewords based on estimated numbers of decoding iterations, in accordance with certain embodiments of the present disclosure.

FIG. 7 illustrates an example flow 700 for decoding of codewords based on estimated numbers of decoding iterations, in accordance with certain embodiments of the present disclosure. An LDPC error correction system that includes a BF decoder and a MS decoder is described as performing particular operations of the example flow 700. This system is an example of the error correction system 600 of FIG. 6. In an example, the LDPC error correction system includes one or more processors and one or more memories. The memory(ies) stores computer-readable instructions to embody functionalities specific to the LDPC error correction system. The instructions when executed by the processor(s) of the system result in performance of the functionalities by the system. The instructions stored in the memory(ies) in conjunctions with the underlying processor(s) represent means for performing the functionalities. Although the operations are illustrated in a particular order, other arrangement of the operations are possible and some of the operations may be skipped as it would be apparent to a person skilled in the art. In the interest of clarity of explanation, the example flow 700 is illustrated in connection with the decoding of a codeword. However, the example flow 700 similarly applies to the decoding of a larger number of codewords.

As illustrated, the example flow 700 starts at operation 702, where the LDPC error correction system accesses a first codeword. For instance, upon a read command of a host, a controller of the LDPC error correction system receives "r" bits representing a hard read of the first codeword from a memory storage location. Some of the "r" bits can include errors (e.g., a bit that is actually a "1" is hard reader as a "0" and vice versa).

At operation 704, the LDPC error correction system computes a checksum of the first codeword. For instance, the checksum is computed as "S=r×H," where "H" is the parity check matrix.

At operation 706, the LDPC error correction system estimates a first number of decoding iterations for decoding the first codeword by the BF decoder. For instance, a checksum-number of decoding iterations association is stored in local memory of the LDPC error correction system. The controller performs a look up of this association by using the checksum and determines the first number of decoding iterations.

At operation 708, the LDPC error correction system computes an accumulated number of decoding iterations, where this accumulated number is associated with the BF decoder. For instance, the controller maintains a counter, where each time a codeword is dispatched to the BF decoder, the estimated number of decoding iterations to decode this codeword by the BF decoder is added to the latest value of counter. Each time a codeword that was buffered and that is now decoded, the estimated number of decoding iterations is decreased from the latest value of the counter. Here, the controller computes the accumulated number by adding the estimated first number of decoding iterations to the latest counter. As such, if a second codeword is already buffered in the BF decoder's memory buffer and has not been decoded yet, the accumulated number is the sum of the estimated first number of decoding iterations, the estimated second number of decoding iterations corresponding to the second codeword, and any other such estimated number(s) of decoding iterations corresponding to currently buffered codeword(s) if any.

At operation 710, the LDPC error correction system compares the accumulated number to a number threshold "L." For instance, the number threshold "L" is predefined. This number threshold "L" can be static. Alternatively, the threshold number "L" is variable, where its value depends on the life of the memory storing the codeword. For instance, the older the memory is, the larger the number threshold "L" becomes. If the comparison indicates that the accumulated number is smaller than the threshold number "L," operation 712 follows operations 710. Otherwise, operations 716 follows operation 710.

At operation 712, the LDPC error correction system stores the first codeword in the BF decoder's memory buffer. For instance, the "r" bits of the first codeword are placed in queue in the memory buffer for decoding by the BF decoder.

At operation 714, the LDPC error correction system decodes the first codeword. For instance, the BF decoder performs LDPC decoding operations on the various codewords buffered in its memory buffer dependent on how they are queued in this memory buffer. The BF decoder outputs information bits upon the decoding of the first codeword.

At operation 716, the LDPC error correction system compares the checksum of the codeword to a checksum threshold "T." The checksum threshold "T" can be pre-defined. If the comparison indicates that the checksum is smaller than the checksum threshold "T," operation 712 follows operation 716. Otherwise, operation 718 follows operations 716.

At operation 718 the LDPC error correction system stores the first codeword in the MS decoder's memory buffer. Here, both the accumulated number and checksum are greater than the respective codewords. Accordingly, decoding the first codeword with the BF decoder is likely not effective. Instead, a decision is made to decode the first codeword with the MS decoder. The the "r" bits of the first codeword are placed in queue in the memory buffer of the MS decoder for decoding by the MS decoder.

At operation 720, the LDPC error correction system decodes the first codeword. For instance, the MS decoder performs LDPC decoding operations on the various codewords buffered in its memory buffer dependently on how they are queued in this memory buffer. The MS decoder outputs information bits upon the decoding of the first codeword.

Figure 8:
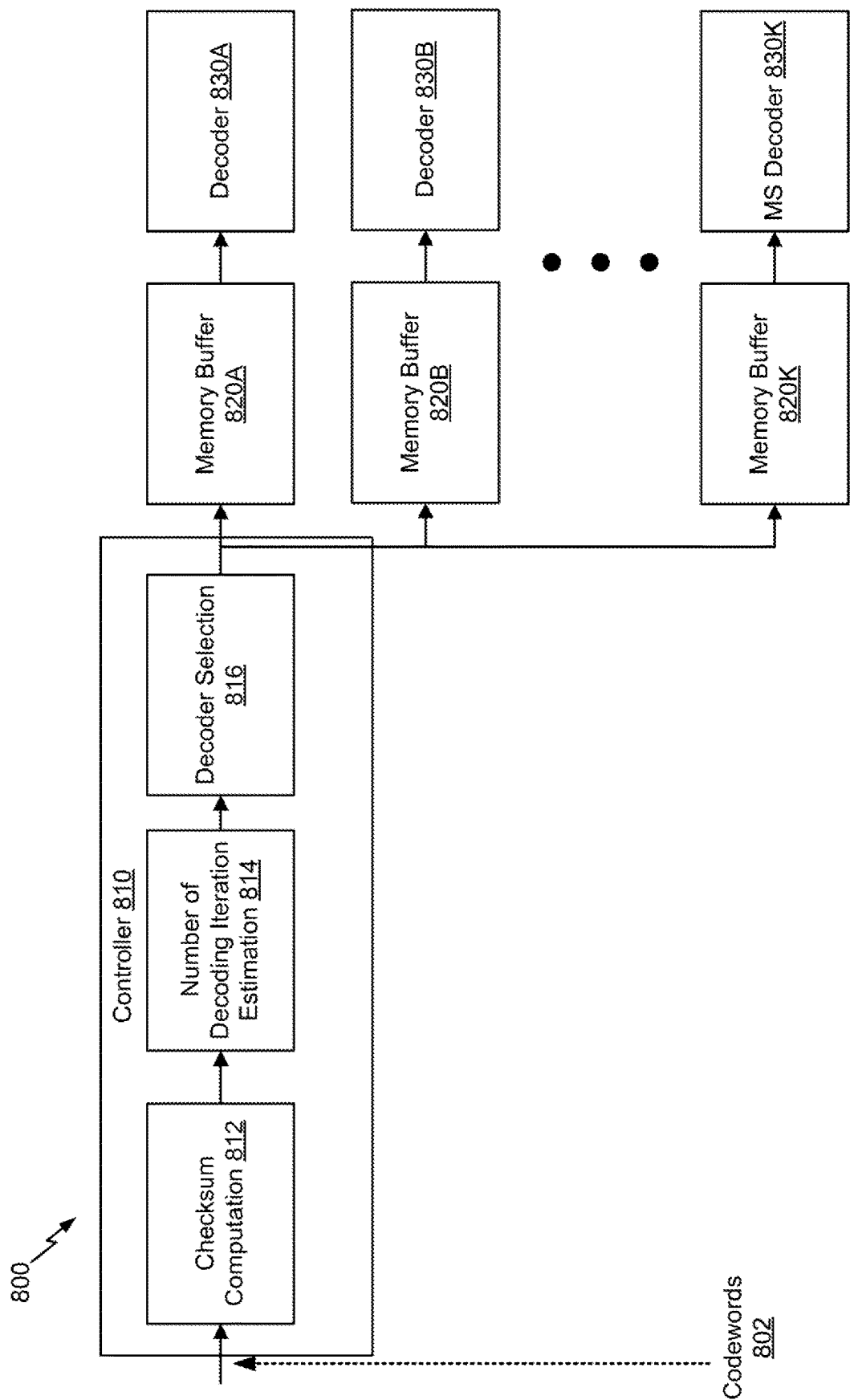
FIG. 8 illustrates another example error correction system that includes multiple decoders and that balances the decoding of codewords based on estimated numbers of decoding iterations, in accordance with certain embodiments of the present disclosure.

FIG. 8 illustrates another example error correction system 800 that includes multiple decoders and that balances the decoding of codewords based on estimated numbers of decoding iterations, in accordance with certain embodiments of the present disclosure. Similarly to the error correction system 600 of FIG. 6, here the example error correction system 800 includes a controller 810 and the multiple decoders. The number of decoders can be greater than two and each of such decoders has a memory buffer.

As illustration in FIG. 8, the error correction system 800 includes "K" decoders (illustrated as a first decoder 830A, a second decoder 830B, . . . , and a Kth decoder 830K), where "K" is an integer greater than two. Each of the "K" decoders has a memory buffer (illustrated as a first memory buffer 820A, a second memory buffer 820B, . . . , and a Kth memory buffer 820K). Generally, a particular one of the decoders (e.g., the Kth decoder 830K) has a higher error correction capability than the remaining decoders. The remaining decoders (e.g., including the first decoder 830A and the second decoder 830B) have a decoding latency lower than and a decoding throughput greater than that of the particular decoder (e.g., the Kth decoder 803K). These remaining decoders can have the same decoding latency and decoding throughput. Alternatively, the decoding latency and decoding throughput can vary between the remaining decoders (e.g., the first decoder 830A have a decoding latency lower than and a decoding throughput greater than that of the second decoder 830B). For instance, the first decoder 830A and the second decoder 830B can be BF decoder having the same decoding latency and decoding throughput or having different decoding latencies and decoding throughputs, whereas the Kth decoder 830K is an MS decoder.

The controller 810 implements, in software and/or hardware, a decision logic to intelligently distribute the decoding of codewords 802 between the decoders 830A-830K. In an example, the decision logic includes a checksum computation 812 (similar to the checksum computation 612 of FIG. 6), a number of decoding iterations estimation 814 (similar to the number of decoding iterations estimation 614 of FIG. 6), and a decoder selection 816. The decoder selection 816 can compute, per codeword, one or more accumulated number of decoding iterations dependently on parallel implementation, as further described in connection with FIG. 9, or in series implementation, as further described in connection with FIGS. 10-11. Generally, the decoder selection 816 allows the use of a low latency and high throughput decoder (e.g., the first decoder 830A or the second decoder 830K) for the decoding of a codeword when the corresponding accumulated number of decoding iterations is smaller than a number threshold and/or when the corresponding checksum is smaller than a checksum threshold. Otherwise, a high error correction capability (e.g., the Kth decoder 830K) is used for the decoding of the codeword.

Figure 9:
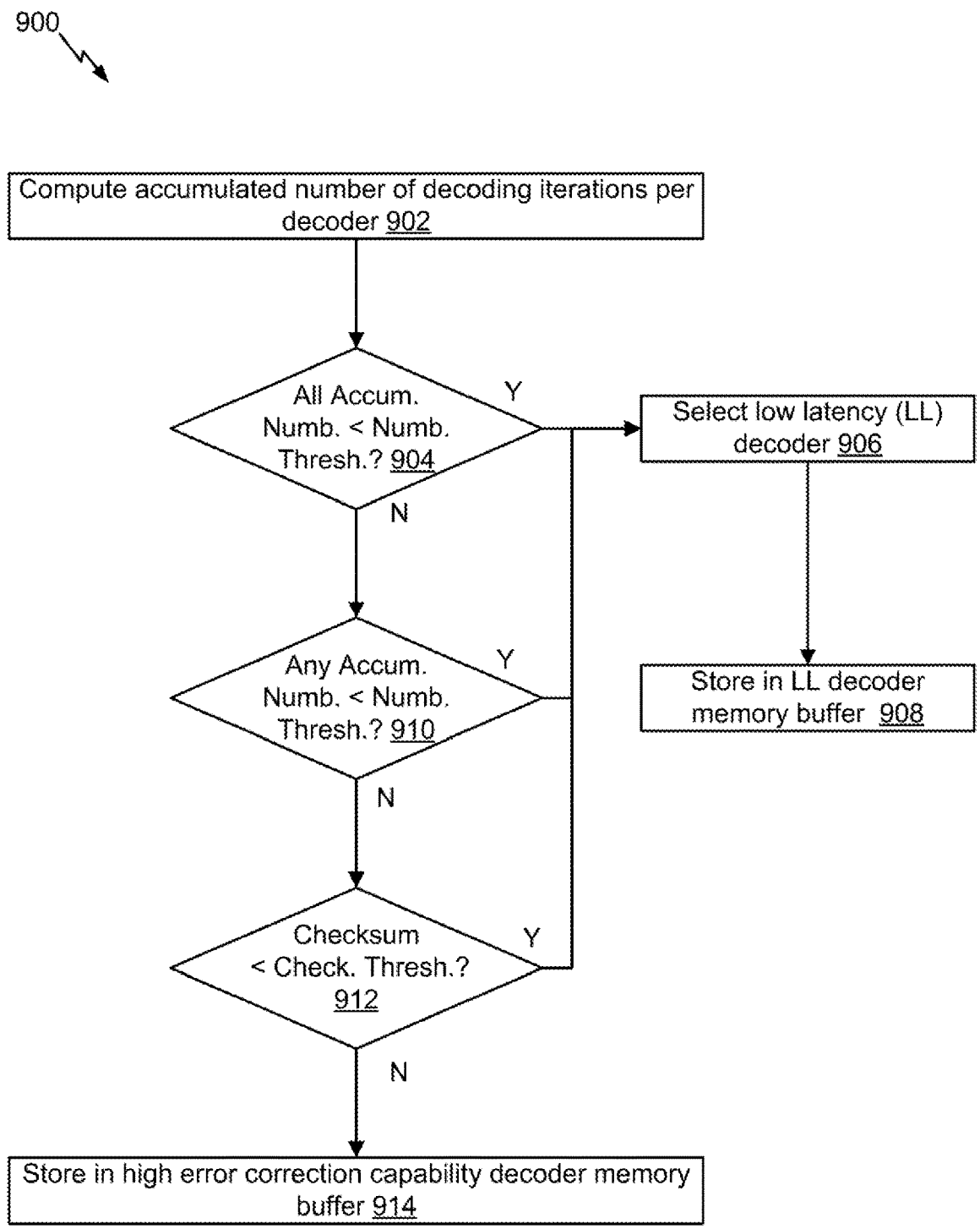
FIG. 9 illustrates another example flow for decoding of codewords based on estimated numbers of decoding iterations, in accordance with certain embodiments of the present disclosure.
Figure 10:
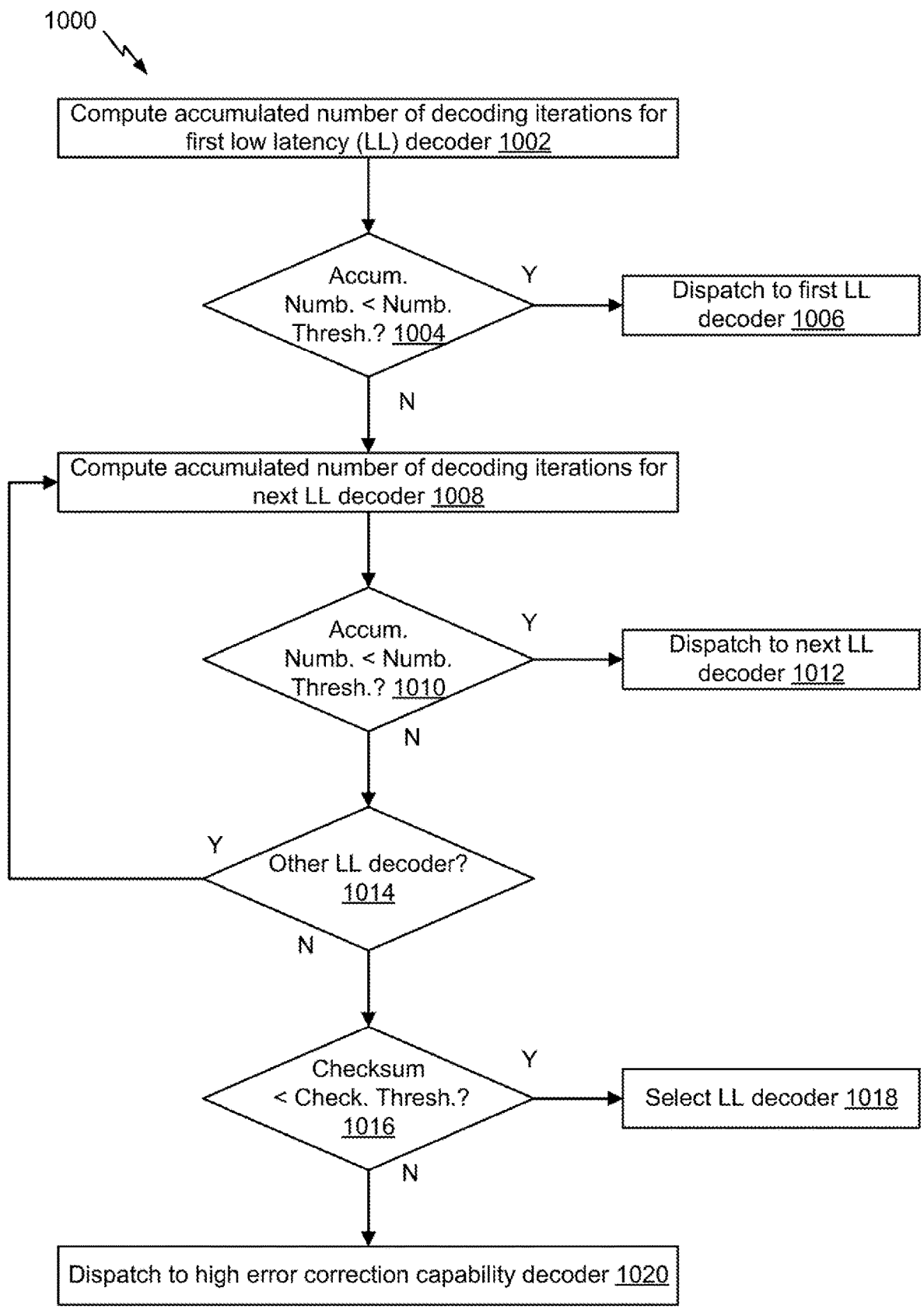
FIG. 10 illustrates yet another example flow for decoding of codewords based on estimated numbers of decoding iterations, in accordance with certain embodiments of the present disclosure.
Figure 11:
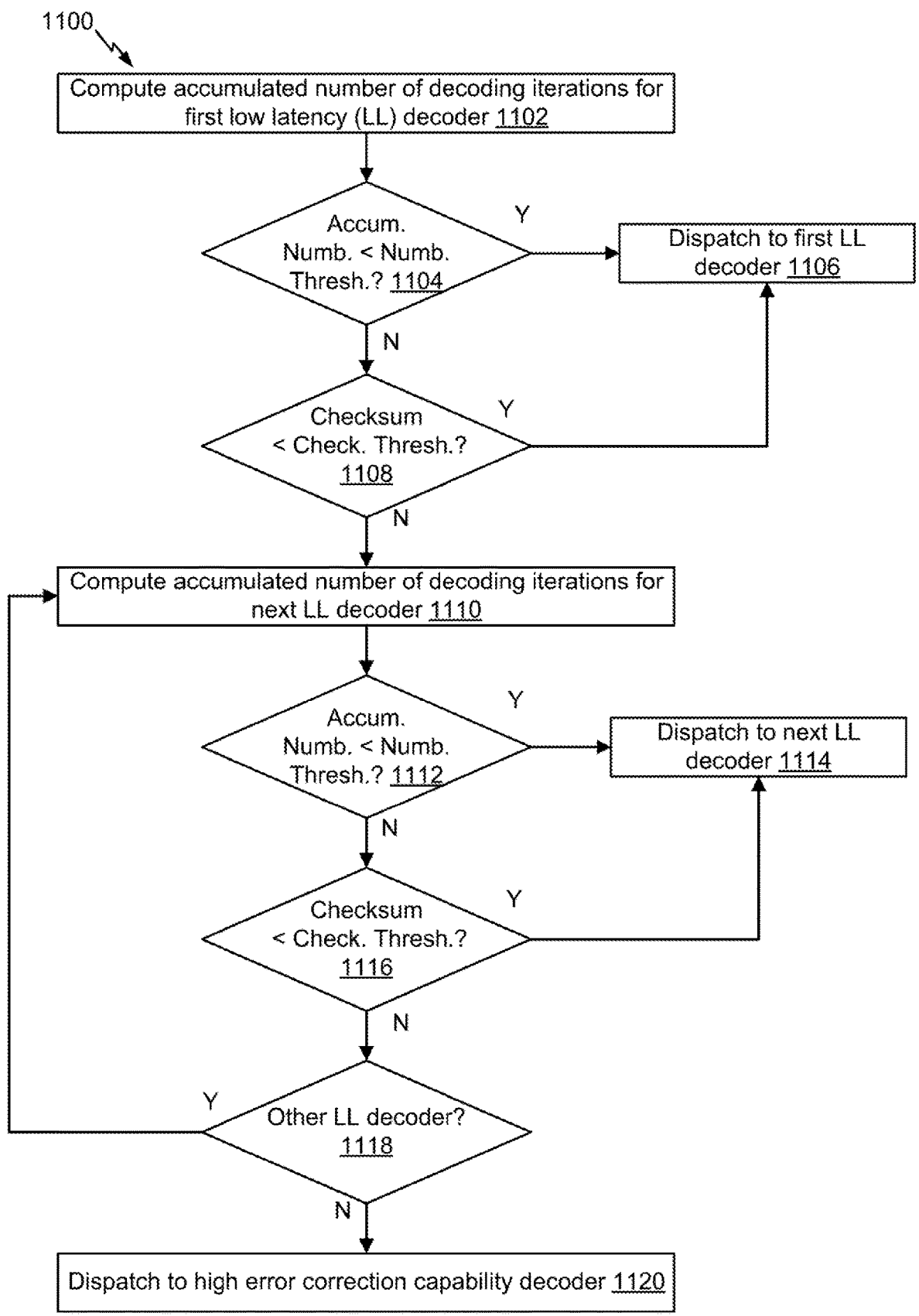
FIG. 11 illustrates a further example flow for decoding of codewords based on estimated numbers of decoding iterations, in accordance with certain embodiments of the present disclosure.

FIGS. 9-11 illustrate example flows for decoding codewords using more than two decoders. An LDPC error correction system that includes the multiple decoders is described as performing particular operations of the example flows. This system is an example of the error correction system 800 of FIG. 8. In an example, the LDPC error correction system includes one or more processors and one or more memories. The memory(ies) stores computer-readable instructions to embody functionalities specific to the LDPC error correction system. The instructions when executed by the processor(s) of the system result in performance of the functionalities by the system. The instructions stored in the memory(ies) in conjunctions with the underlying processor(s) represent means for performing the functionalities. Although the operations are illustrated in a particular order, other arrangement of the operations are possible and some of the operations may be skipped as it would be apparent to a person skilled in the art. In the interest of clarity of explanation, the example flows are illustrated in connection with the decoding of a codeword. However, the example flows similarly apply to the decoding of a larger number of codewords. In addition, operations related to accessing a codeword, computing a checksum, estimating a number of decoding iterations, and decoding the codeword are not illustrated in the example flows, but apply to such flows similarly to the corresponding operations of the flow 700 of FIG. 7.

FIG. 9 illustrates another example flow 900 for decoding of codewords based on estimated numbers of decoding iterations, in accordance with certain embodiments of the present disclosure. Here, for each codeword to be decoded, accumulated numbers of decoding iterations are initially computed per low decoding latency and high decoding throughput decoder (e.g., the first decoder 830A and the second decoder 830B) to decide on where to dispatch the codeword.

The example flow 900 can start at operation 902, where the LDPC error correction system computes an accumulated number of decoding iterations per decoder to decode a first codeword. For instance, a checksum is computed for this first codeword, similarly to 706. A number of decoding iterations is also estimated based on the checksum and for each of the decoders (e.g., an estimated first number of decoding iterations needed by the first decoder 830A to decode the first codeword, and an estimated second number of decoding iterations needed by the second decoder 830B to decode the first codeword). Thereafter, each estimated number of decoding iterations is added to the latest value of a corresponding counter to generate the accumulated number per decoder (e.g., the estimated first number is added to the latest value of the first counter maintained for the first decoder 830A to generate a first accumulated number; similarly, the estimated second number is added to the latest value of the second counter maintained for the second decoder 830B to generate a first accumulated number).

At operation 904, the LDPC error correction system determines whether all of the accumulated numbers computed for the first codeword and corresponding to the low decoding latency and high decoding throughput decoders (e.g., the first decoder 830A and the second decoder 830B) are smaller than a number threshold (e.g., a predefined number threshold "L"). If so, operation 906 follows operation 904. Otherwise, operation 910 follows operation 904.

At operation 906, the LDPC error correction system selects one of the low decoding latency and high decoding throughput decoders (e.g., either the first decoder 830A or the second decoder 830B) to decode the first codeword. In one example, the selection can be random. In another example, the selection can depend on the accumulated number of decoding iterations. In particular, the decoder that corresponds to the smallest accumulated number can be selected. Yet in another example, if the candidate decoders have different decoding latencies and decoding throughputs, the one having the smallest decoding latency and highest decoding throughput can be selected.

At operation 908, the LDPC error correction system stores the first codewords in the memory buffer corresponding to the selected low decoding latency and high decoding throughput decoder. For instance, the "r" bits of the first codeword are placed in queue in the memory buffer.

At operation 910, the LDPC error correction system determines if any of the accumulated numbers are smaller than the number threshold. If only one accumulated number is smaller than the number threshold, the corresponding decoder is selected at operation 906 following operation 910. If more than one accumulated numbers are smaller than the number threshold, operation 906 follows operation 910 to select one of such decoders as explained herein above. Otherwise, operation 912 follows operation 910.

At operation 912, the LDPC error correction system compares the checksum of the first codeword to a checksum threshold (e.g., a predefined checksum threshold "T"). Here, all the accumulated numbers are larger than the number threshold. If the checksum is smaller than the checksum threshold, operation 906 follows operation 912 to select one of the low decoding latency and high decoding throughput decoders. Otherwise, operation 914 follows operation 912.

At operation 914, the LDPC error correction system stores the first codeword in the memory buffer of the high error correction capability decoder (e.g., the Kth memory buffer 820K). Here, all the accumulated numbers are larger than the number threshold and the checksum is larger than the checksum threshold. Accordingly, a decision is made to decode the first codeword with the high error correction capability decoder (e.g., the Kth decoder 830K). Accordingly, the "r" bits of the first codeword are placed in queue in the memory buffer of this decoder.

FIG. 10 illustrates yet another example flow 1000 for decoding of codewords based on estimated numbers of decoding iterations, in accordance with certain embodiments of the present disclosure. Here, for each codeword to be decoded, accumulated numbers of decoding iterations are sequentially computed as needed per low decoding latency and high decoding throughput decoder (e.g., the first decoder 830A and the second decoder 830B) to decide on where to dispatch the codeword.

The example flow 1000 starts at operation 1002, where the LDPC error correction system computes a first accumulated number of decoding iterations needed by a first low decoding latency and high decoding throughput decoder (e.g., the first decoder 830A) to decode the first codeword. This computation is similar to operation 708 of FIG. 7.

At operation 1004, the LDPC error correction system compares the first accumulated number to a number threshold (e.g., a predefined number threshold "L"). If the first accumulated number is smaller than the number threshold, operation 1006 follows operation 1004. Otherwise, operation 1008 follows operation 1006.

At operation 1006, the LDPC error correction system dispatches the first codeword to the first low decoding latency and high decoding throughput (e.g., the first decoder 830A). For instance, the "r" bits of the first codeword are placed in queue in the memory buffer of this decoder.

At operation 1008, the LDPC error correction system computes a second accumulated number of decoding iterations needed by a next available low decoding latency and high decoding throughput decoder (e.g., the second decoder 830B) to decode the first codeword. This computation is similar to operation 708 of FIG. 7.

At operation 1010, the LDPC error correction system compares the second accumulated number to a number threshold (which may, but need not, be the same as the number threshold used at operation 1004). If the second accumulated number is smaller than the number threshold, operation 1012 follows operation 1010. Otherwise, operation 1014 follows operation 1010.

At operation 1012, the LDPC error correction system dispatches the first codeword to the next available low decoding latency and high decoding throughput (e.g., the second decoder 830B). For instance, the "r" bits of the first codeword are placed in queue in the memory buffer of this decoder.

At operation 1014, the LDPC error correction system determines whether a next available low decoding latency and high decoding throughput decoder is available for the decoding of the first codeword. If so, the LDPC error correction system loops back to operation 1008. Otherwise, operation 1016 follows operation 1014.

At operation 1016, the LDPC error correction system compares the checksum of the first codeword to a checksum threshold (e.g., a predefined threshold "T"). If the checksum is smaller than the checksum threshold, operation 1018 follows operation 1016. Otherwise, operation 1020 follows operation 1016.

At operation 1018, the LDPC error correction system selects one of the low decoding latency and high decoding throughput decoders (e.g., either the first decoder 830A or the second decoder 830B) to decode the first codeword. This operation is similar to operation 906 of FIG. 9. The first codeword is then dispatched to selected decoder.

At operation 1020, the LDPC error correction system dispatches the first codeword to the high error correction capability decoder (e.g., the Kth decoder 830K). Here, all the accumulated numbers are larger than the number threshold and the checksum is larger than the checksum threshold. Accordingly, a decision is made to decode the first codeword with the high error correction capability decoder. Accordingly, the "r" bits of the first codeword are placed in queue in the memory buffer of this decoder (e.g., the memory buffer 820K).

FIG. 11 illustrates a further example flow 1100 for decoding of codewords based on estimated numbers of decoding iterations, in accordance with certain embodiments of the present disclosure. Here, for each codeword to be decoded, accumulated numbers of decoding iterations are sequentially computed as needed per low decoding latency and high decoding throughput decoder (e.g., the first decoder 830A and the second decoder 830B) and the codeword's checksum is sequentially compared to one or more checksum thresholds to decide on where to dispatch the codeword.

The example flow 1100 starts at operation 1102, where the LDPC error correction system computes a first accumulated number of decoding iterations needed by a first low decoding latency and high decoding throughput decoder (e.g., the first decoder 830A) to decode the first codeword. This computation is similar to operation 708 of FIG. 7.

At operation 1104, the LDPC error correction system compares the first accumulated number to a number threshold (e.g., a predefined number threshold "L"). If the first accumulated number is smaller than the number threshold, operation 1106 follows operation 1104. Otherwise, operation 1108 follows operation 1106.

At operation 1106, the LDPC error correction system dispatches the first codeword to the first low decoding latency and high decoding throughput (e.g., the first decoder 830A). For instance, the "r" bits of the first codeword are placed in queue in the memory buffer of this decoder.

At operation 1108, the LDPC error correction system compares the checksum of the first codeword to a checksum threshold (e.g., a predefined threshold "T"). If the checksum is smaller than the checksum threshold, operation 1106 follows operation 1108. Otherwise, operation 1110 follows operation 1108.

At operation 1110, the LDPC error correction system computes a second accumulated number of decoding iterations needed by a next available low decoding latency and high decoding throughput decoder (e.g., the second decoder 830B) to decode the first codeword. This computation is similar to operation 708 of FIG. 7.

At operation 1112, the LDPC error correction system compares the second accumulated number to a number threshold (which may, but need not, be the same as the number threshold used at operation 1104). If the second accumulated number is smaller than the number threshold, operation 1114 follows operation 1112. Otherwise, operation 1116 follows operation 1112.

At operation 1114, the LDPC error correction system dispatches the first codeword to the next available low decoding latency and high decoding throughput (e.g., the second decoder 830B). For instance, the "r" bits of the first codeword are placed in queue in the memory buffer of this decoder.

At operation 1116, the LDPC error correction system compares the checksum of the first codeword to a checksum threshold (e.g., which may, but need not, be the same as the checksum threshold used at operation 1108). If the checksum is smaller than the checksum threshold, operation 1114 follows operation 1116. Otherwise, operation 1118 follows operation 1116.

At operation 1118, the LDPC error correction system determines whether a next available low decoding latency and high decoding throughput decoder is available for the decoding of the first codeword. If so, the LDPC error correction system loops back to operation 1110. Otherwise, operation 1120 follows operation 1118.

At operation 1120, the LDPC error correction system dispatches the first codeword to the high error correction capability decoder (e.g., the Kth decoder 830K). Here, all the accumulated numbers are larger than the number threshold and the checksum is larger than the checksum threshold. Accordingly, a decision is made to decode the first codeword with the high error correction capability decoder. Accordingly, the "r" bits of the first codeword are placed in queue in the memory buffer of this decoder (e.g., the memory buffer 820K).

Figure 12:
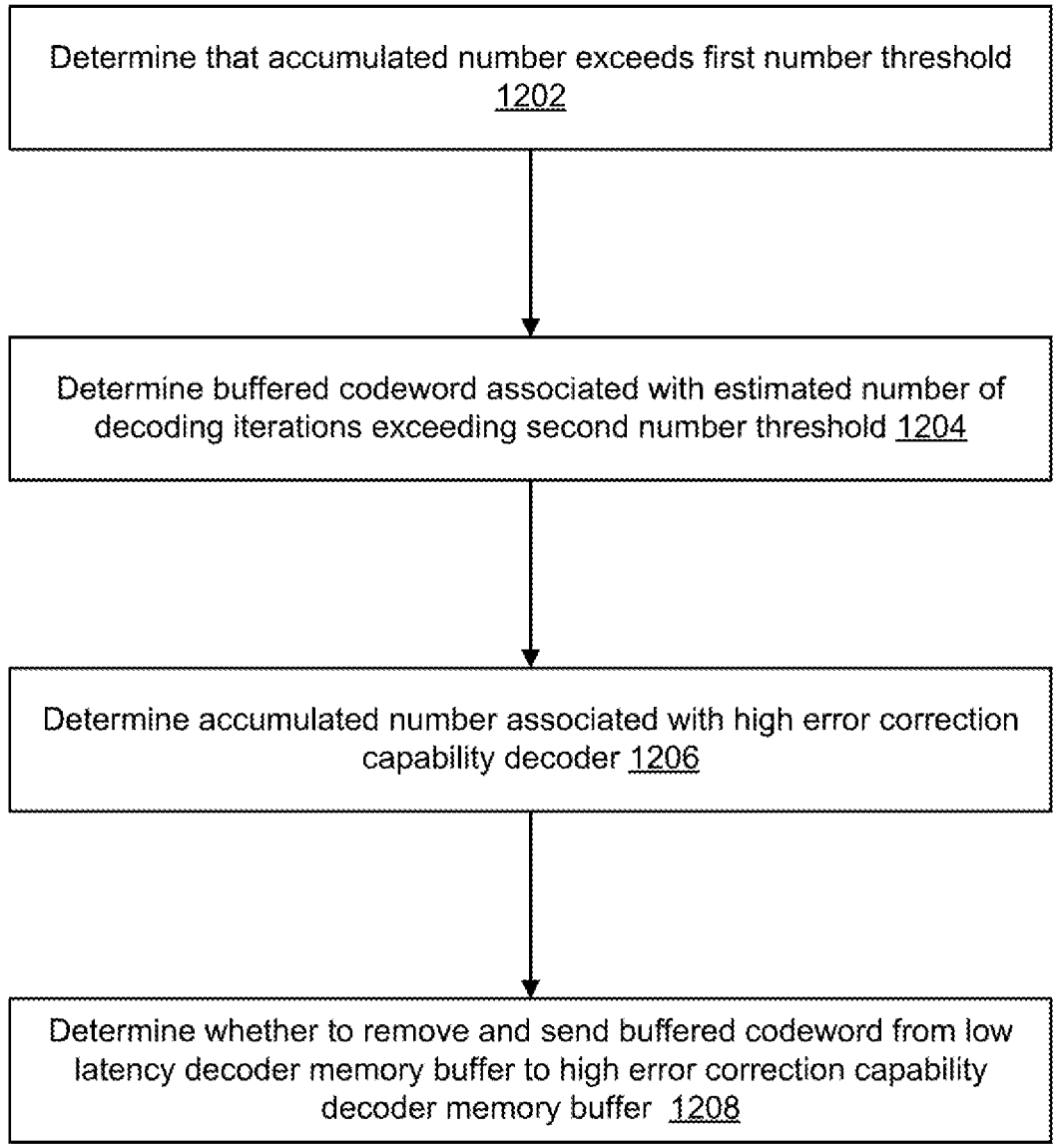
FIG. 12 illustrates an example flow for removing and sending codewords between memory buffers of decoders, in accordance with certain embodiments of the present disclosure.

FIG. 12 illustrates an example flow 1200 for removing and sending codewords between memory buffers of decoders, in accordance with certain embodiments of the present disclosure. An LDPC error correction system that includes the multiple decoders is described as performing particular operations of the example flow. This system is an example of the error correction system 600 of FIG. 6 or the error correction system 800 of FIG. 8. In an example, the LDPC error correction system includes one or more processors and one or more memories. The memory(ies) stores computer-readable instructions to embody functionalities specific to the LDPC error correction system. The instructions when executed by the processor(s) of the system result in performance of the functionalities by the system. The instructions stored in the memory(ies) in conjunctions with the underlying processor(s) represent means for performing the functionalities. Although the operations are illustrated in a particular order, other arrangement of the operations are possible and some of the operations may be skipped as it would be apparent to a person skilled in the art. In the interest of clarity of explanation, the example flows are illustrated in connection with the decoding of a codeword. However, the example flows similarly apply to the decoding of a larger number of codewords.

The example flow 1200 starts at operation 1202, where the LDPC error correction system determines that an accumulated number exceeds a first number threshold. For instance, the accumulated number corresponds to a first decoder (e.g., a low decoding latency and high decoding throughput decoder) and is computed for a first codeword, similarly to the operation 708 of FIG. 6. The first number threshold can be a first predefined number threshold "L." Because the accumulated number exceeds the first number threshold, a determination is made to rebalance the distribution of the codewords already buffered in the memory buffer of the first decoder and not yet decoded by the first decoder.

At operation 1204, the LDPC error correction system determines a second codeword that is buffered in the memory buffer of the first decoder and that has not been yet decoded by the first decoder, where this second codeword is associated with an estimated second number of decoding iterations that exceed a second number threshold. For instance, the second number of decoding iterations is estimated based on a second checksum of the second codeword and corresponds to the estimated number of decoding iterations needed by the first decoder to decode the second codeword. The second number threshold is a predefined threshold "X," generally smaller than the first predefined threshold number "L." Because the second codeword has a larger estimated second number of decoding iterations (e.g., larger than the second number threshold), this second codeword is a candidate codeword that can be removed from the memory buffer of the first decoder and dispatched to a second decoder instead (e.g., a decoder that has a relatively better error correction capability).

At operation 1206, the LDPC error correction system determines a second accumulated number associated with the second decoder. For instance, this second accumulated number is the latest value of the counter maintained for the second decoder.

At operation 1208, the LDPC error correction system determines whether to remove the second codeword from the memory buffer of the first codeword and send the second codeword to the memory buffer of the second decoder. In an example, this decision is based on whether the second accumulated number is smaller than a third number threshold (e.g., a second predefined number threshold "L" that may, but need not, be the same as the first predefined number threshold "L"). If the second accumulated number is smaller than the third number threshold, the "r" bits are copied and deleted from the memory buffer of the first decoder and placed in queue in the memory buffer of the second decoder. Otherwise, the second codeword is maintained in the memory buffer of the first decoder.

Figure 13:
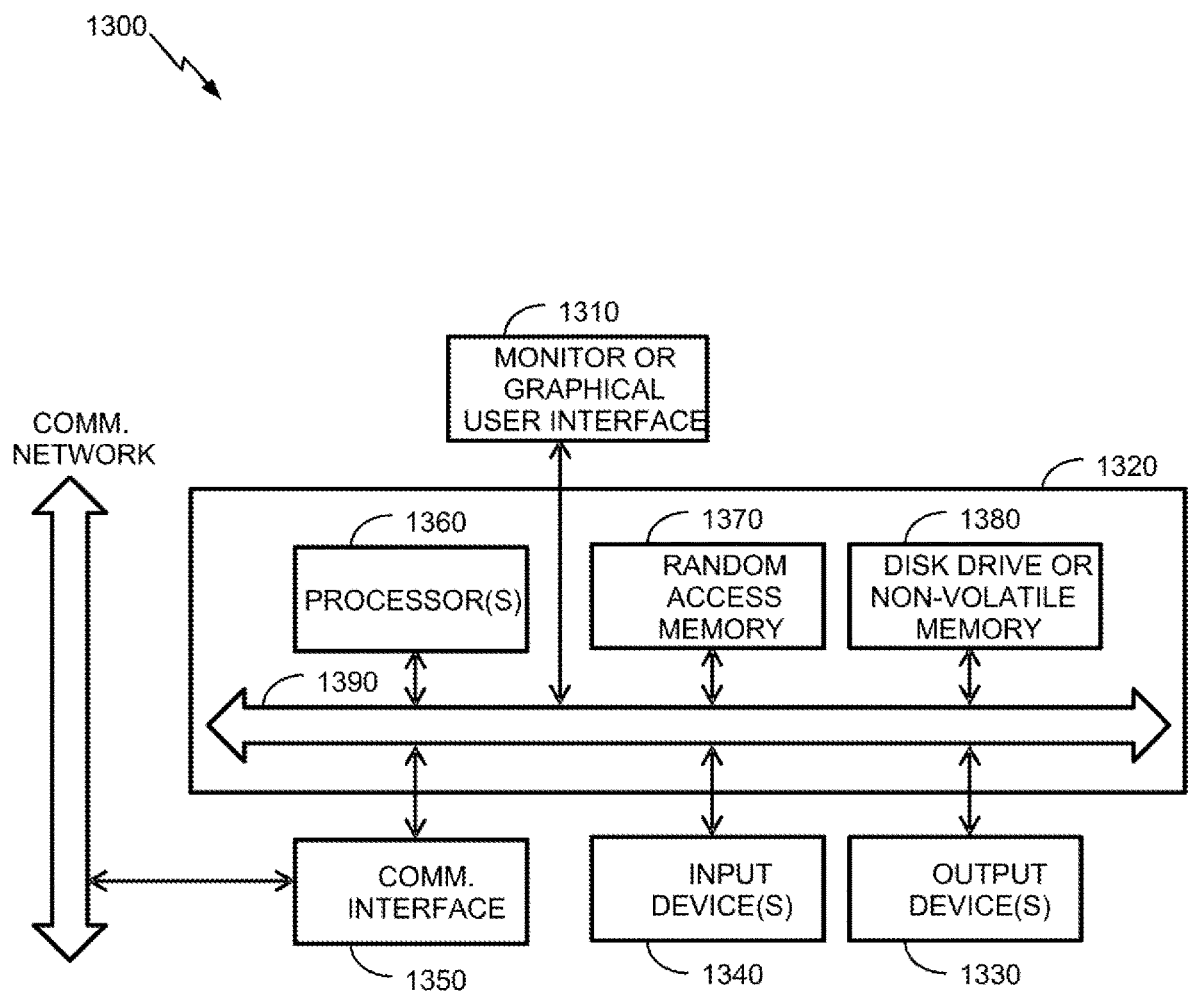
FIG. 13 describes one potential implementation of a system which may be used, according to certain embodiments of the present disclosure.

FIG. 13 describes one potential implementation of a system which may be used, according to certain embodiments of the present disclosure. FIG. 13 is merely illustrative of an embodiment of the present disclosure and does not limit the scope of the disclosure as recited in the claims. In one embodiment, the system is a computer system 1300 that typically includes a monitor 1310, a computer 1320, user output devices 1330, user input devices 1340, communications interface 1350, and the like.

As shown in FIG. 13, the computer 1320 may include a processor(s) 1360 that communicates with a number of peripheral devices via a bus subsystem 1390. These peripheral devices may include the user output devices 1330, the user input devices 1340, the communications interface 1350, and a storage subsystem, such as random access memory (RAM) 1370 and disk drive 1380.

The user input devices 1330 include all possible types of devices and mechanisms for inputting information to the computer system 1320. These may include a keyboard, a keypad, a touch screen incorporated into the display, audio input devices such as voice recognition systems, microphones, and other types of input devices. In various embodiments, the user input devices 1330 are typically embodied as a computer mouse, a trackball, a track pad, a joystick, wireless remote, drawing tablet, voice command system, eye tracking system, and the like. The user input devices 1330 typically allow a user to select objects, icons, text and the like that appear on the monitor 1310 via a command such as a click of a button or the like.

The user output devices 1340 include all possible types of devices and mechanisms for outputting information from the computer 1320. These may include a display (e.g., the monitor 1310), non-visual displays such as audio output devices, etc.

The communications interface 1350 provides an interface to other communication networks and devices. The communications interface 1350 may serve as an interface for receiving data from and transmitting data to other systems. Embodiments of the communications interface 1350 typically include an Ethernet card, a modem (telephone, satellite, cable, ISDN), (asynchronous) digital subscriber line (DSL) unit, FireWire interface, USB interface, and the like. For example, the communications interface 1350 may be coupled to a computer network, to a FireWire bus, or the like. In other embodiments, the communications interfaces 1350 may be physically integrated on the motherboard of the computer 1320, and may be a software program, such as soft DSL, or the like.

In various embodiments, the computer system 1300 may also include software that enables communications over a network such as the HTTP, TCP/IP, RTP/RTSP protocols, and the like. In alternative embodiments of the present disclosure, other communications software and transfer protocols may also be used, for example IPX, UDP or the like. In some embodiments, the computer 1320 includes one or more Xeon microprocessors from Intel as the processor(s) 1360. Further, one embodiment, the computer 1320 includes a UNIX-based operating system.

The RAM 1370 and the disk drive 1380 are examples of tangible media configured to store data such as embodiments of the present disclosure, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. The RAM 1370 and the disk drive 1380 may be configured to store the basic programming and data constructs that provide the functionality of the present disclosure.

Software code modules and instructions that provide the functionality of the present disclosure may be stored in the RAM 1370 and the disk drive 1380. These software modules may be executed by the processor(s) 1360. The RAM 1370 and the disk drive 1380 may also provide a repository for storing data used in accordance with the present disclosure.

The RAM 1370 and the disk drive 1380 may include a number of memories including a main random access memory (RAM) for storage of instructions and data during program execution and a read only memory (ROM) in which fixed non-transitory instructions are stored. The RAM 1370 and the disk drive 1380 may include a file storage subsystem providing persistent (non-volatile) storage for program and data files. The RAM 1370 and the disk drive 1380 may also include removable storage systems, such as removable flash memory.

The bus subsystem 1390 provides a mechanism for letting the various components and subsystems of the computer 1320 communicate with each other as intended. Although the bus subsystem 1390 is shown schematically as a single bus, alternative embodiments of the bus subsystem may utilize multiple busses.

FIG. 13 is representative of a computer system capable of embodying the present disclosure. It will be readily apparent to one of ordinary skill in the art that many other hardware and software configurations are suitable for use with the present disclosure. For example, the computer may be a desktop, portable, rack-mounted, or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present disclosure can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present disclosure. The logic may form part of a computer program product adapted to direct an information-processing device to perform a set of steps disclosed in embodiments of the present disclosure. Based on the disclosure and teachings provided herein, a person of ordinary skill in the art will appreciate other ways and/or methods to implement the present disclosure.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

Although the foregoing embodiments have been described in some detail for purposes of clarity of understanding, the disclosure is not limited to the details provided. There are many alternative ways of implementing the disclosure. The disclosed embodiments are illustrative and not restrictive.

What is claimed is:

1. A method of decoding codewords stored in a memory, the method implemented by an error correction system that includes multiple decoders, the method comprising:
    accessing a first codeword that is to be decoded by one of the multiple decoders, the multiple decoders comprising a first decoder and a second decoder, the first decoder having a lower decoding latency than the second decoder;
    estimating a first number of decoding iterations for decoding the first codeword by the first decoder;
    determining an estimated second number of decoding iterations for decoding a second codeword by the first decoder, the second codeword buffered in a first memory buffer of the first decoder;
    determining that the first codeword is to be stored in a memory buffer of the error correction system, the memory buffer being one of the first memory buffer of the first decoder or a second memory buffer of the second decoder dependently on the estimated first number and the estimated second number; and
    storing the first codeword in the memory buffer.

2. The method of claim 1, further comprising:
computing a checksum of the first codeword, wherein the first number of decoding iterations is estimated based on the checksum.

3. The method of claim 2, wherein the first number of decoding iterations is defined as a function of the checksum, wherein the function is stored by the error correction system and is used to estimate the first number of decoding iterations upon the computation of the checksum.

4. The method of claim 3, wherein the function is stored as a checksum-number of decoding iterations curve.

5. The method of claim 3, wherein the function is defined based on at least one testing or simulation of performance of instances of the first decoder.

6. The method of claim 2, further comprising:
computing an accumulated number of decoding iterations as a sum of at least the estimated first number and the estimated second number;
comparing the accumulated number and a number threshold; and
selecting the memory buffer to be one of the first memory buffer or the second memory buffer based on an outcome of the comparison of the accumulated number and the number threshold.

7. The method of claim 6, wherein the number threshold is variable based on a life of the memory.

8. The method of claim 6, wherein the memory buffer is selected to be the first memory buffer and not the second memory buffer based on the comparison indicating that the accumulated number is smaller than the number threshold.

9. The method of claim 6, wherein the comparison indicates that the accumulated number is greater than the number threshold, and the method further comprising:
comparing the checksum and a checksum threshold; and
selecting the memory buffer to be one of the first memory buffer or the second memory buffer based on an outcome of the comparison of the checksum to the checksum threshold.

10. The method of claim 9, wherein the memory buffer is selected to be the first memory buffer and not the second memory buffer based on the comparison indicating that the checksum is smaller than the checksum threshold.

11. The method of claim 9, wherein the memory buffer is selected to be the second memory buffer and not the first memory buffer based on the comparison indicating that the checksum is greater than the checksum threshold.

12. An error correction system comprising:
multiple decoders comprising a first decoder and a second decoder, the first decoder having a lower decoding latency than the second decoder; and
a controller configured with program code to:
access a first codeword that is to be decoded by one of the multiple decoders;
estimate a first number of decoding iterations for decoding the first codeword by the first decoder;
determine an estimated second number of decoding iterations for decoding a second codeword by the first decoder, the second codeword buffered in a first memory buffer of the first decoder;
determine that the first codeword is to be stored in a memory buffer of the error correction system, the memory buffer being one of the first memory buffer of the first decoder or a second memory buffer of the second decoder dependently on the estimated first number and the estimated second number; and
store the first codeword in the memory buffer.

13. The error correction system of claim 12, wherein the first codeword is a low density parity check (LDPC) codeword, wherein the first decoder is a bit flipping (BF) decoder, and wherein the second decoder is a min-sum (MS) decoder.

14. The error correction system of claim 12, wherein the controller is further configured to:
compute a checksum of the first codeword, wherein the first number of decoding iterations is estimated based on a function that defines the checksum as a variable;
compute a first accumulated number of decoding iterations as a sum of at least the estimated first number of decoding iterations and the estimated second number of decoding iterations; and
select the memory buffer to be one of the first memory buffer or the second memory buffer based on a comparison of the first accumulated number and a number threshold.

15. The error correction system of claim 14, wherein the multiple decoders comprise a third decoder that has a lower decoding latency than the second decoder, and wherein the controller is further configured to:
determine that the first accumulated number is greater than the number threshold;
determine an estimated third number of decoding iterations for decoding a third codeword by the third decoder, the third codeword buffered in a third memory buffer of the third decoder;
compute a second accumulated number of decoding iterations as a sum of at least the estimated first number of decoding iterations and the estimated third number of decoding iterations; and
select the memory buffer to be one of the second memory buffer or the third memory buffer and not the first memory buffer based on a comparison of the second accumulated number and the number threshold.

16. The error correction system of claim 14, wherein the multiple decoders comprise a third decoder that has a lower decoding latency than the second decoder, and wherein the controller is further configured to:
determine that the first accumulated number is greater than the number threshold;
determine an estimated third number of decoding iterations for decoding a third codeword by the third decoder, the third codeword buffered in a third memory buffer of the third decoder;
compute a second accumulated number of decoding iterations as a sum of at least the estimated first number of decoding iterations and the estimated third number of decoding iterations;
determine that the second accumulated number is greater than the number threshold;
determine that the checksum is smaller than a checksum threshold; and
select the memory buffer to be one of the first memory buffer or the third memory buffer and not the second memory buffer based on the first accumulated number and the second accumulated number being greater than the number threshold and based on the checksum being smaller than the checksum threshold.

17. The error correction system of claim 14, wherein the multiple decoders comprise a third decoder that has a lower decoding latency than the second decoder, and wherein the controller is further configured to:
determine an estimated third number of decoding iterations for decoding a third codeword by the third decoder, the third codeword buffered in a third memory buffer of the third decoder;

compute a second accumulated number of decoding iterations as a sum of at least the estimated first number of decoding iterations and the estimated third number of decoding iterations;

determine that each of the first accumulated number and the second accumulated number is smaller than the number threshold; and select the memory buffer to be one of the first memory buffer or the third memory buffer and not the second memory buffer based on the first accumulated number and the second accumulated number being smaller than the number threshold.

18. A memory device storing computer-readable instructions, that upon execution by an error correction system of the memory device, cause the error correction system to perform operations comprising:

accessing a first codeword that is to be decoded by one of multiple decoders of the error correction system, the multiple decoders comprising a first decoder and a second decoder, the first decoder having a lower decoding latency than the second decoder;

estimating a first number of decoding iterations for decoding the first codeword by the first decoder;

determining an estimated second number of decoding iterations for decoding a second codeword by the first decoder, the second codeword buffered in a first memory buffer of the first decoder;

determining that the first codeword is to be stored in a memory buffer of the error correction system, the memory buffer being one of the first memory buffer of the first decoder or a second memory buffer of the second decoder dependently on the estimated first number and the estimated second number; and storing the first codeword in the memory buffer.

19. The memory device of claim 18, wherein the operations further comprise:

computing a checksum of the first codeword, wherein the first number of decoding iterations is estimated based on the checksum;

computing an accumulated number of decoding iterations as a sum of at least the estimated first number of decoding iterations and the estimated second number of decoding iterations;

determining that the accumulated number exceeds a number threshold; and removing and sending the second codeword from the first memory buffer to the second memory buffer based on the accumulated number exceeding the number threshold.

20. The memory device of claim 19, wherein the operations further comprise:

determining that the estimated second number of decoding iterations exceeds a second number threshold;

determining an estimated third number of decoding iterations for decoding a third codeword by the second decoder, the third codeword buffered in the second memory buffer of the second decoder;

computing a second accumulated number of decoding iterations based on the estimated third number; and determining that the second accumulated number is smaller than a third number threshold, wherein the second codeword is removed and sent from the first memory buffer to the second memory buffer based on the estimated second number of decoding iterations exceeding the second number threshold and on the second accumulated number being smaller than the third number threshold.

* * * * *